(12) United States Patent
Shin

(10) Patent No.: US 7,209,393 B2
(45) Date of Patent: Apr. 24, 2007

(54) SEMICONDUCTOR MEMORY DEVICE AND METHOD FOR MULTIPLEXING WRITE DATA THEREOF

(75) Inventor: Beom Ju Shin, Icheon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 91 days.

(21) Appl. No.: 11/153,338

(22) Filed: Jun. 16, 2005

(65) Prior Publication Data

US 2006/0171211 A1    Aug. 3, 2006

(30) Foreign Application Priority Data

Jan. 28, 2005    (KR) .................... 10-2005-0008133

(51) Int. Cl.
*G11C 7/10* (2006.01)

(52) U.S. Cl. .............................. 365/189.02; 365/189.05

(58) Field of Classification Search ..................... None
See application file for complete search history.

(56) References Cited

U.S. PATENT DOCUMENTS

| | | | | |
|---|---|---|---|---|
| 5,406,525 A | * | 4/1995 | Nicholes | 365/230.02 |
| 5,497,347 A | * | 3/1996 | Feng | 365/189.07 |
| 5,673,227 A | * | 9/1997 | Engles et al. | 365/200 |
| 6,198,682 B1 | | 3/2001 | Proebsting | 365/207 |
| 6,307,790 B1 | | 10/2001 | Roohparvar et al. | 365/189.01 |
| 6,570,809 B1 | * | 5/2003 | Lin | 365/230.02 |
| 6,678,191 B2 | | 1/2004 | Lee et al. | 365/185.17 |
| 6,735,674 B2 | | 5/2004 | Lee | 711/140 |
| 6,879,524 B2 | * | 4/2005 | Monzel | 365/189.05 |
| 6,950,370 B2 | * | 9/2005 | Lee | 365/233 |
| 2003/0099135 A1 | | 5/2003 | Stubbs | |

FOREIGN PATENT DOCUMENTS

JP    6084362    3/1994

* cited by examiner

*Primary Examiner*—Tan T. Nguyen
(74) *Attorney, Agent, or Firm*—Lowe Hauptman & Berner, LLP

(57) ABSTRACT

A semiconductor memory device including a write multiplexer unit that multiplexes write data transmitted to a global I/O bus disposed in front of a write driver. The semiconductor memory device further includes a memory core region including an array of memory cells, a data input path that receives data to be written into the memory cells from the outside, a first bus that receives the data through the data input path, a multiplexing unit that multiplexes the data received from the first bus, and a driving unit that selects and drives the multiplexed data.

27 Claims, 25 Drawing Sheets

SEMICONDUCTOR MEMORY DEVICE AND METHOD FOR MULTIPLEXING WRITE DATA THEREOF

BACKGROUND

1. Field of the Invention

The present invention relates to a semiconductor memory device and method for multiplexing write data thereof. More specifically, the present invention relates to a semiconductor memory device and method for multiplexing write data thereof, wherein write data input through a DQ pad are multiplexed in front of a write driving unit of a memory core region.

2. Discussion of Related Art

DRAMs are classified into X4, X8 and X16 according to data widths, and fabrication using different packages. Generally, however, since X4, X8 and X16 are designed at once, the DRAMs operate differently depending upon X4, X and X16. In the case of X16, sixteen data bits are input/output. In the case of X8, eight data bits are input/output. In the case of X4, only four data bits are input/output.

Therefore, even in the case of the same global I/O bus GIO, not only data input to different pads DQ are transmitted to a memory core region depending upon X4, X8 and X16 at the time of a write operation, but also data output from a memory cell are output to different pads DQ even in the case of the same global I/O bus and even upon read operation.

Furthermore, the prefetch concept has emerged while the DRAM shifts from a SDR DRAM to a DDR DRAM. In the DDR SDRAM, 2-bit data are accessed from a memory cell every clock cycle and are then output to a data pad, which is called 2-bit prefetch. In a DDR2 SDRAM, 4-bit data are accessed from a memory cell every clock cycle and are then output to a data pad, which is called 4-bit prefetch. In a DDR3 SDRAM, 8-bit data are accessed from a memory cell every clock cycle and are then output to a data pad, which is called 8-bit prefetch.

For example, in a DDR2 SDRAM, if a data width is X16, the DDR2 SDRAM is 4-bit prefetch. Thus, 4*16=64 data bits are moved with the DRAM at the same time.

FIG. 1 is a block diagram showing a write path being a data input path among a data I/O path.

Referring to FIG. 1, DQ pads DQ<0:15> receive write data to be written into memory cells (not shown) form the outside upon a write operation. Sixteen write data bits output from the DQ pads DQ<0:15> are transmitted to a global I/O bus GIO through an input buffer 100, a write latch unit 200, a write multiplexer unit 300 and a data amplifier unit 400. At this time, the write multiplexer unit 300 is disposed between the data amplifier unit 400 and the write latch unit 200, and multiplexes the write data received from the write latch unit 200 and then transmits the multiplexed write data to the data amplifier unit 400. The data amplifier unit 400 selects only data that will be written into memory cells (not shown) according to a highest row address (ROW<12>; 256 Mb DDR2 SDRAM) and a column address COL<11>, and sends the selected data to the global I/O bus GIO. A write driving unit 500 drives the write data received from the global I/O bus GIO, and then sends them to local I/O buses LIO and LIOB.

FIGS. 2 to 6 show paths along which write data U<0:7> and L<0:7> received through the DQ pads and the write latch unit 200 are multiplexed in the write multiplexer unit 300, and are then transmitted to the data amplifier unit 400.

Referring to FIGS. 2 to 6, the DQ pad receives the write data U<0:7> and L<0:7> from the outside and then outputs them. The write latch unit 200 consists of sixteen write latch circuits UDQ<0:7> and LDQ<0:7>. The write multiplexer unit 300 includes sixteen write multiplexers 301 to 316. The data amplifier unit 400 has sixteen data I/O sense amplifiers USA<0:7> and LSA<0:7>.

FIG. 2 is a block diagram showing the operation of the write multiplexer unit 300 when a data width is X4.

In the case where the data width is X4, the write multiplexers 301 to 316 multiplex four write data bits L<0:3> output from the write latch circuits LDQ<0:3> into 16, and then send the multiplexed write data to the sixteen data I/O sense amplifiers USA<0:7> and LSA<0:7>, respectively.

The operation in which the write multiplexers 301 to 316 multiplex the four write data bits L<0:3> output from the write latch circuits LDQ<0:3> into 16, and then send the multiplexed write data to the sixteen data I/O sense amplifiers USA<0:7> and LSA<0:7>, respectively, will now be described in detail with reference to FIG. 2 and FIGS. 6A to 6P.

First, if the write data bits L<0> transmitted to the write latch circuit LDQ<0> are input to the write multiplexer 308 shown in FIG. 6H, and a transfer gate TG22 is thus turned on according to a signal X4, the write data L<0> is transmitted to the data I/O sense amplifier USA<7> through a first metal line (a data line 300-11 composed of metal 1), a second metal line (a data line 310-1 compose of metal 2), and a first metal line 300-1. Further, if the write data bits L<0> are also input to the write multiplexer 301 shown in FIG. 6A and a transfer gate TG1 is thus turned on according to the signal X4, the write data bits L<0> are sent to the data I/O sense amplifier USA<0> through the first metal line 300-11, a second metal line 310-4 and a first metal line 300-4. If the write data L<0> are input to the write multiplexer 316 shown in FIG. 6P, and a transfer gate TG39 is thus turned on according to the signal X4, the write data bits L<0> are transmitted to the sense amplifier LSA<7> through the first metal line 300-11, the second metal line 310-10 and the first metal line 300-10. If the write data bits L<0> are input to the write multiplexer 309 shown in FIG. 6I, and a transfer gate TG25 is thus turned on according to the signal X4, the write data bits L<0> are directly transmitted to the data I/O sense amplifier LSA<7> through the first metal line 300-11.

Second, if the write data bits L<1> transmitted to the write latch circuit LDQ<1> are input to the write multiplexers 307, 302, 315, 310 shown in FIGS. 6G, 6B, 6O and 6J, respectively, and transfer gates TG19, TG4, TG37 and TG27 are respectively turned on according to the signal X4, in the same manner as the first method, the write data bits L<1> are transmitted to the data I/O sense amplifiers USA<6>, USA<1> and LSA<6> and LSA<1>, respectively, through the first metal line 300-12, the second metal lines 310-2, 310-3, 310-9, and the first metal lines 300-2, 300-3 and 300-9.

Third, if the write data bits L<2> transmitted to the write latch circuit LDQ<2> are input to the write multiplexers 303, 305, 311, 313 shown in FIGS. 6C, 6E, 6K and 6M, respectively, and transfer gates TG7, TG11, TG29 and TG32 are respectively turned on according to the signal X4, in the same manner as the first method, the write data L<2> are transmitted to the data I/O sense amplifiers USA<2>, USA<4> and LSA<2> and LSA<4>, respectively, through the first metal line 300-14, the second metal lines 310-6, 310-8, 310-12, and the first metal lines 300-6, 300-8 and 300-16.

Fourth, if the write data bits L<3> transmitted to the write latch circuit LDQ<3> are input to the write multiplexers 304, 306, 312, 314 shown in FIGS. 6D, 6F, 6L and 6N, respectively, and transfer gates TG9, TG15, TG30 and TG35 are respectively turned on according to the signal X4, in the same manner as the first method, the write data L<3> are transmitted to the data I/O sense amplifiers USA<3>, USA<5> and LSA<3> and LSA<5>, respectively, through the first metal line 300-13, the second metal lines 310-5, 310-7, 310-11, and the first metal lines 300-5, 300-7 and 300-15.

As described above, the write data bits L<0:3> transmitted to the write latch circuits LDQ<0:3> are transmitted to the sixteen data I/O sense amplifiers USA<0:7> and LSA<0:7> through the sixteen first metal lines 300-1 to 300-16 and the twelve second metal lines 310-1 to 310-12.

Then, the data amplifier unit 400 selects only four data from the sixteen write data according to the highest row address ROW<12> and the column address COL<11>, which have information indicating into which memory cell the data will be written, and sends them to the four global I/O buses GIO_L<0:3>.

FIG. 3 is a block diagram showing the operation of the write multiplexer unit 300 when a data width is X8.

In the case where the data width is X8, the write multiplexer 300 multiplexes eight write data bits L<0:7> output from the write latch circuits LDQ<0:7> into 16, and then sends the multiplexed write data to the sixteen data I/O sense amplifiers USA<0:7> and LSA<0:7>, respectively.

The operation in which the write multiplexer 300 multiplexes eight write data bits L<0:7> output from the write latch circuits LDQ<0:7> into 16, and then sends the multiplexed write data to the sixteen data I/O sense amplifiers USA<0:7> and LSA<0:7>, respectively, will now be described in detail with reference to FIG. 3 and FIGS. 6A to 6P.

First, if the write data bits L<0> transmitted to the write latch circuit LDQ<0> are input to the write multiplexers 301, 309 shown in FIGS. 6A, 6I, and the transfer gates TG1, TG25 are thus turned on, respectively, according to the signal X8, the write data L<0> is transmitted to the data I/O sense amplifiers USA<0>, USA<7> through the first metal line 300-11, the second metal line 310-4, and the first metal line 300-4.

Second, if the write data bits L<1> transmitted to the write latch circuit LDQ<1> are input to the write multiplexers 302, 310 shown in FIGS. 6B and 6J, respectively, and the transfer gates TG4, TG27 are respectively turned on according to the signal X8, the write data L<1> are transmitted to the data I/O sense amplifiers USA<1> and LSA<1>, respectively, through the first metal line 300-12, the second metal line 310-3, and the first metal line 300-3.

Third, if the write data bits L<2> transmitted to the write latch circuit LDQ<2> are input to the write multiplexers 303, 311 shown in FIGS. 6C, 6K, respectively, and the transfer gates TG7, TG29 are respectively turned on according to the signal X8, the write data bits L<2> are transmitted to the data I/O sense amplifiers USA<2> and LSA<2>, respectively, through the first metal line 300-14, the second metal line 310-6, and the first metal line 300-6.

Fourth, if the write data bits L<3> transmitted to the write latch circuit LDQ<3> are input to the write multiplexers 304, 312 shown in FIGS. 6D, 6L, respectively, and the transfer gates TG9, TG30 are respectively turned on according to the signal X8, the write data bits L<3> are transmitted to the data I/O sense amplifiers USA<3> and LSA<3>, respectively, through the first metal line 300-13, the second metal line 310-5, and the first metal line 300-5.

Fifth, if the write data bits L<4> transmitted to the write latch circuit LDQ<4> are input to the write multiplexers 305, 311 shown in FIGS. 6E, 6M, respectively, and the transfer gates TG12, TG31 are respectively turned on according to the signal X8, the write data bits L<4> are transmitted to the data I/O sense amplifiers USA<4> and LSA<4>, respectively, through the first metal line 300-16, the second metal line 310-16, and the first metal line 300-8.

Sixth, if the write data bits L<5> transmitted to the write latch circuit LDQ<5> are input to the write multiplexers 306, 314 shown in FIGS. 6F, 6N, respectively, and the transfer gates TG16, TG34 are respectively turned on according to the signal X8, the write data bits L<5> are transmitted to the data I/O sense amplifiers USA<5> and LSA<5>, respectively, through the first metal line 300-15, the second metal line 310-15, and the first metal line 300-7.

Seventh, if the write data bits L<6> transmitted to the write latch circuit LDQ<6> are input to the write multiplexers 307, 315 shown in FIGS. 6G, 6O, respectively, and the transfer gates TG20, TG38 are respectively turned on according to the signal X8, the write data bits L<6> are transmitted to the data I/O sense amplifiers USA<6> and LSA<6>, respectively, through the first metal line 300-9, the second metal line 310-14, and the first metal line 300-2.

Eighth, if the write data bits L<7> transmitted to the write latch circuit LDQ<7> are input to the write multiplexers 308, 316 shown in FIGS. 6H, 6P, respectively, and the transfer gates TG23, TG40 are respectively turned on according to the signal X8, the write data bits L<7> are transmitted to the data I/O sense amplifiers USA<7> and LSA<7>, respectively, through the first metal line 300-10, the second metal line 310-13, and the first metal line 300-1.

As described above, the write data bits L<0:7> transmitted to the write latch circuits LDQ<0:7> are transmitted to the sixteen data I/O sense amplifiers USA<0:7> and LSA<0:7> through the sixteen first metal lines 300-1 to 300-16 and the eighth second metal lines 310-3 to 310-6, 310-13 to 310-16.

Then, the data amplifier unit 400 selects only eight of the sixteen write data according to the highest row address ROW<12>, which has information indicating into which memory cell the data will be written, and sends the selected eight data to the eight global I/O buses GIO_L<0:7>.

FIG. 4 is a block diagram showing the operation of the write multiplexer unit 300 when a data width is X16.

In the case where the data width is X16, the sixteen write data bits U<0:7> and L<0:7> output from the write latch circuits UDQ<0:7> and LDQ0:7> are transmitted to the sixteen data I/O sense amplifiers USA<0:7> and LSA<0:7>, which correspond to each other one to one.

The operation in which the write multiplexers 301 to 316 multiplex the sixteen write data bits U<0:7> and L<0:7> output from the write latch circuits UDQ<0:7> and LDQ<0:7> into 16, and then send the multiplexed write data to the sixteen data I/O sense amplifiers USA<0:7> and LSA<0:7>, respectively, will now be described in detail with reference to FIG. 4 and FIGS. 6A to 6P.

If the write data bits U<0:7> and L<0:7> transmitted to the write latch circuits UDQ<0:7> and LDQ<0:7> are input to the write multiplexers 301 to 316 shown in FIGS. 6A to 6P, and the transfer gates TG2, TG5, TG8, TG10, TG13, TG17, TG21, TG24, TG25, TG27, TG29, TG30, TG31, TG34, TG38 and TG40 are turned on according to a X16 signal, the write data bits U<0:7> and L<0:7> are transmitted to the data I/O sense amplifiers USA<0:7, LSA<0:7> through the first metal lines 300-1 to 300-16.

At this time, the write latch circuits UDQ<0:7> and LDQ<0:7> correspond to the sixteen first metal lines 300-1 to 300-16 one to one. The sixteen data I/O sense amplifiers USA<0:7> and LSA<0:7> also correspond to the sixteen first metal lines 300-1 to 300-16 one to one.

As described above, the sixteen write data bits U<0:7> and L<0:7> transmitted to the write latch circuits UDQ<0:7> and LDQ<0:7> are transmitted to the sixteen data I/O sense amplifiers USA<0:7> and LSA<0:7> through the sixteen first metal lines 300-1 to 300-16. Then, the sixteen data I/O sense amplifiers USA<0:7> and LSA<0:7> transmit the sixteen write data bits U<0:7> and L<0:7> to the sixteen global I/O buses GIO_U<0:7> and GIO_L<0:7>.

FIG. 5 is a block diagram showing a path along which the write data bits U<0:7> and L<0:7> are transmitted to the sixteen data I/O sense amplifiers USA<0:7> and LSA<0:7> through the sixteen first metal lines 300-1 to 300-16, and the sixteen second metal lines 310-1 to 310-16 shown in FIGS. 2 to 4.

However, the eighth second metal lines 310-17 to 310-24, which are not provided in FIGS. 2 to 4, are provided in FIG. 5. The reason why the eighth second metal lines 310-17 to 310-24 are provided in FIG. 5 is for transmitting the four write data bits L<0:3> transmitted to the write latch circuit LDQ<0:3> to the sixteen sense amplifiers USA<0:7> and LSA<0:7> through the eighth second metal lines 310-17 to 310-24 in test mode TM.

As described above, in order to transmit the sixteen write data bits U<0:7> and L<0:7>, a total of the twenty-four second metal lines 310-1 to 310-24 and the sixteen first metal lines 300-1 to 300-16 inclusive of the test mode TM are needed.

Since the DDR2 DRAM is 4-bit prefetch, however, a 4*24=96 number of second metal lines are needed. Since the DDR3 DRAM is 8-bit prefetch, a 8*24=192 number of second metal lines are required. Accordingly, assuming that a pitch between the second metal lines is 2 μm, the second metal lines of the DDR2 DRAM occupy the area as much as 2 μm*96 in number=192 μm. The second metal lines of the DDR3 DRAM occupy the area as much as 2 μm*192 in numvber=384 μm.

That is, in the prior art, as the number of prefetch increases, the number of the second metal lines needed to multiplex write data abruptly increases. Thus, there is a problem in that the layout and chip size in the peripheral region of a memory device are significantly large.

Furthermore, in the prior art, in the case where the data width is X4, the four data bits L<0:3> are latched in the write latch units LDQ<0:3> latch, and are then transmitted to the data I/O sense amplifiers USA<0:7> and LSA<0:7> through the write multiplexers 301 to 316. In this process, some write data are applied to the data I/O sense amplifier located at the same located as the I/O pad, and some write data are applied to the data I/O sense amplifier after being transmitted to the second metal lines. As such, since the time when the write data arrive at the data I/O sense amplifier becomes different, there is a problem in that skew occurs between data.

SUMMARY OF THE INVENTION

Accordingly, the present invention has been made in view of the above problems, and it is an object of the present invention to obviate second metal lines that were needed in the prior art, by disposing a write multiplexer unit that multiplexes write data transmitted to a global I/O bus in front of a write driver.

To achieve the above object, according to an aspect of the present invention, there is provided a semiconductor memory device, including a memory core region including an array of memory cells, a data input path that receives data to be written into the memory cells from the outside, a first bus that receives the data through the data input path, a multiplexing unit that multiplexes the data received from the first bus, and a driving unit that selects and drives the multiplexed data, wherein the multiplexing unit and the driving unit are included in the memory core region, and the multiplexing unit is disposed in front of the driving unit, and multiplexes the data.

According to another aspect of the present invention, there is provided a semiconductor memory device, including an array of memory cells, I/O pads that receive data, which will be written into the memory cells, from the outside, latch circuits that latch the data received from the I/O pad units, amplifiers that amplify the data received from the latch circuits, a first bus that receives the amplified data from the amplifiers, multiplexers that multiplex the data received from the first bus, and driving circuits that select and drive the multiplexed data, where the multiplexers are disposed in front of the driving circuits and multiplex the data.

According to still another aspect of the present invention, there is provided a method of multiplexing write data in a semiconductor memory device, including the steps of receiving write data, which will be written into a memory cell, through an I/O pad, latching the write data received from the I/O pad, amplifying the latched write data, transmitting the amplified write data to a first bus, multiplexing the write data output from the first bus, and driving the multiplexed write data, wherein the multiplexing step is performed immediately before the write data are driven.

DETAILED DESCRIPTION OF PREFERRED EMBODIMENTS

Figure 1:
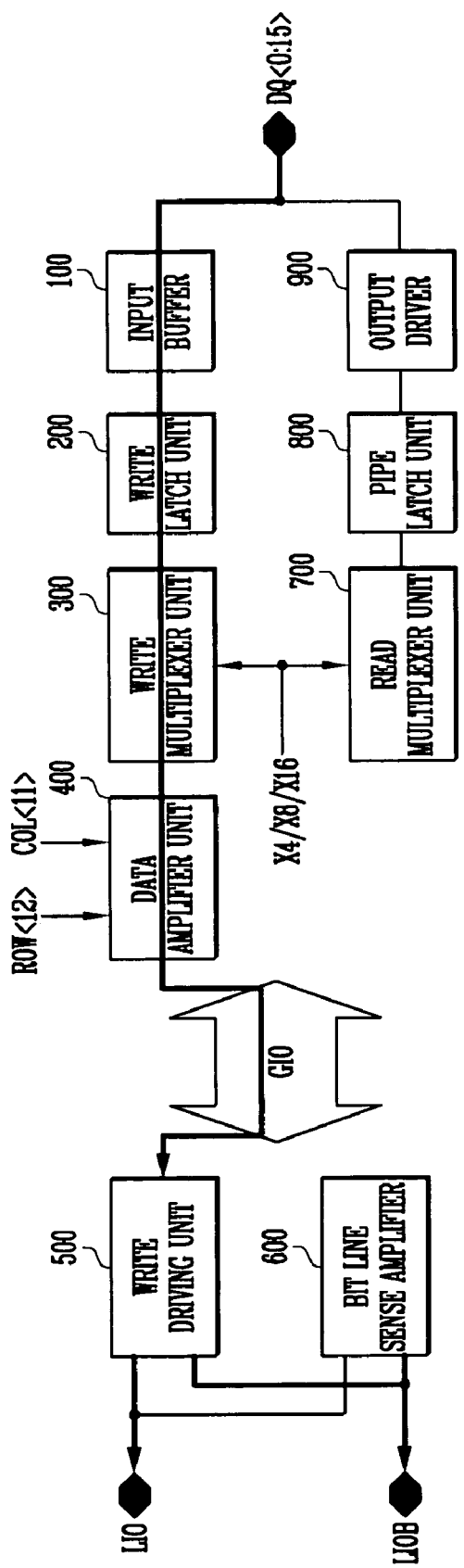
FIG. 1 is a block diagram of a prior art semiconductor memory device having a scheme that multiplexes write data.
Figure 2:
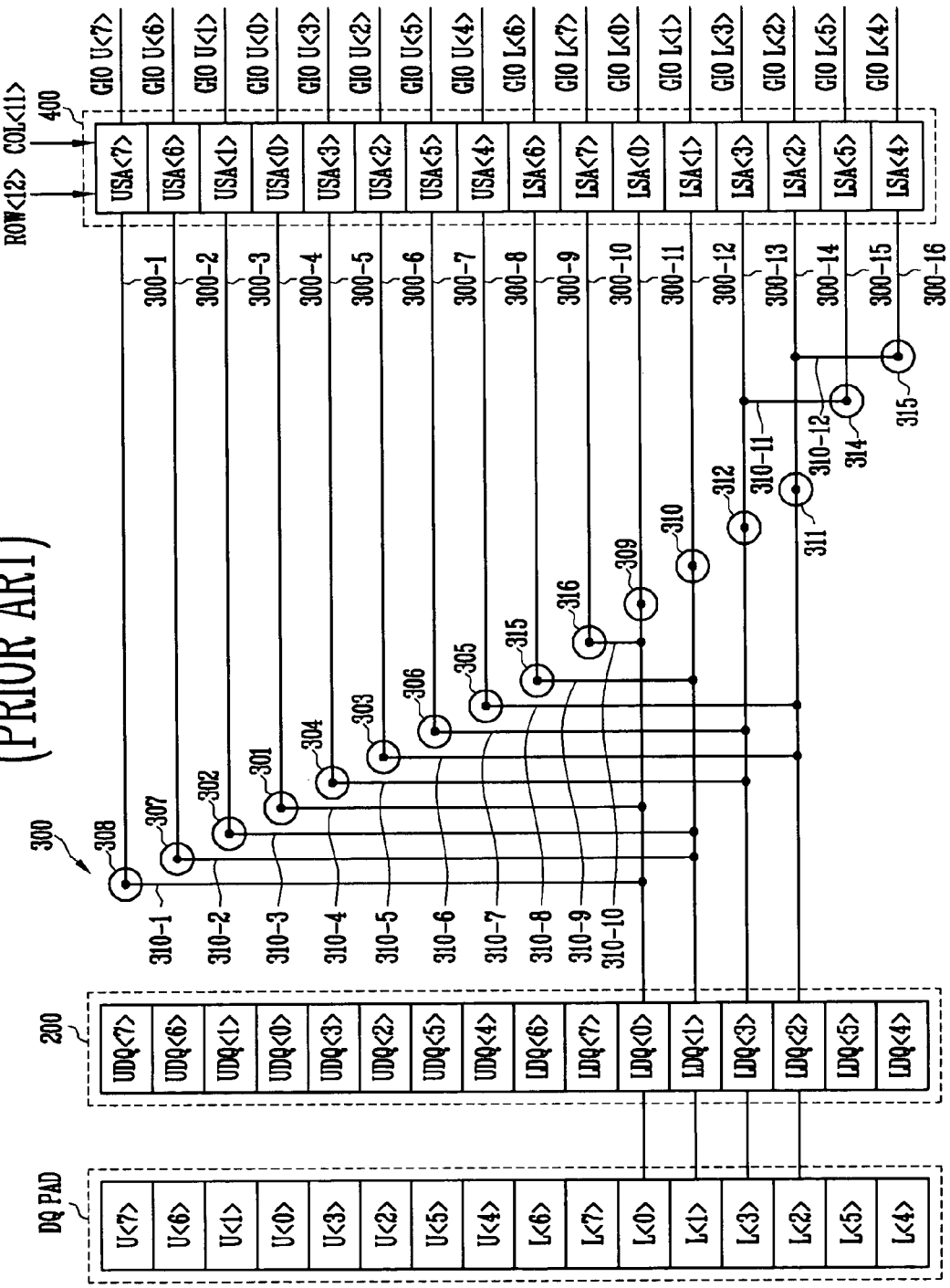
FIG. 2 is a block diagram of a semiconductor memory device having a scheme that multiplexes write data when a data width is X4.
Figure 3:
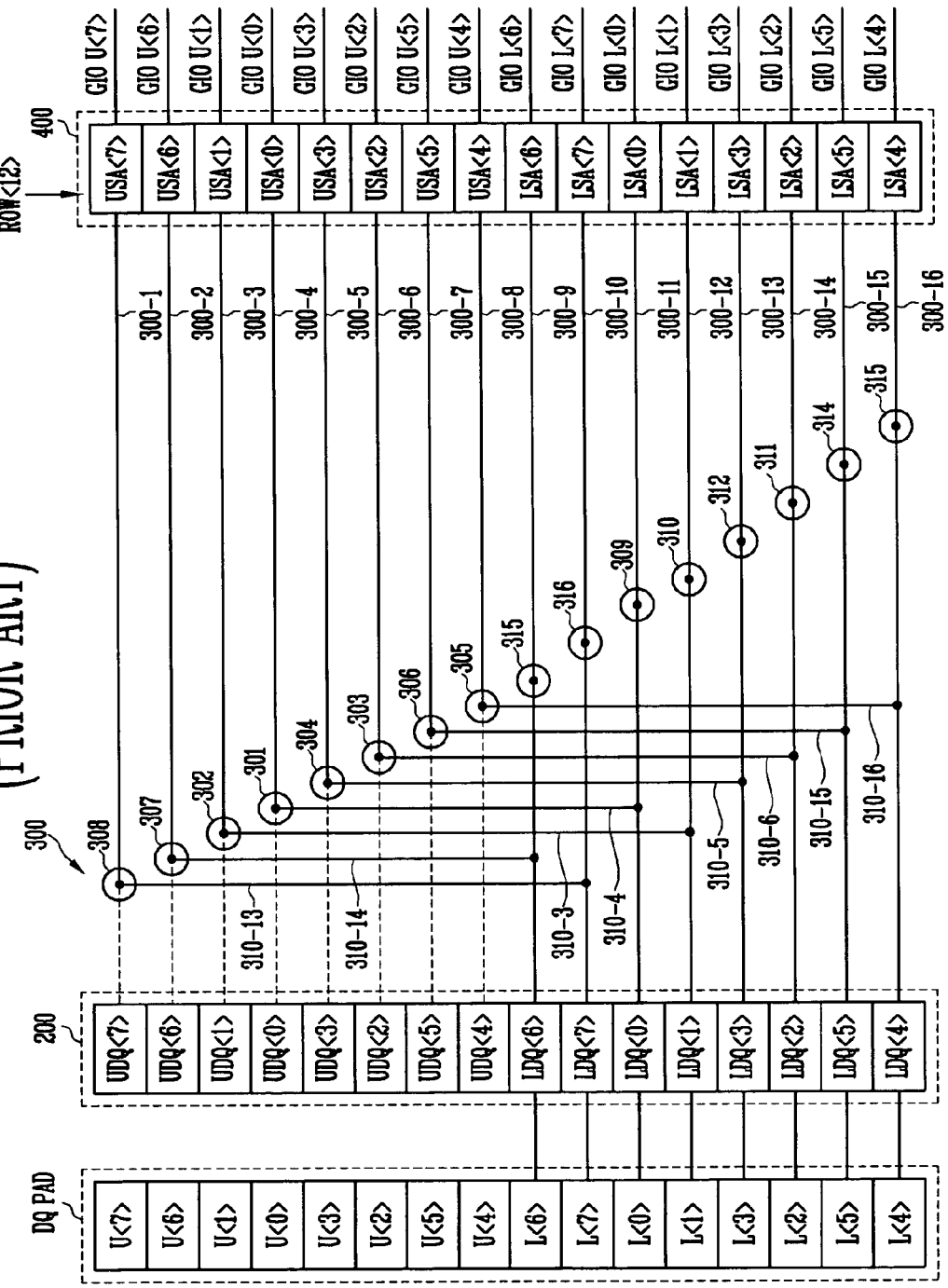
FIG. 3 is a block diagram of a semiconductor memory device having a scheme that multiplexes write data when a data width is X8.
Figure 4:
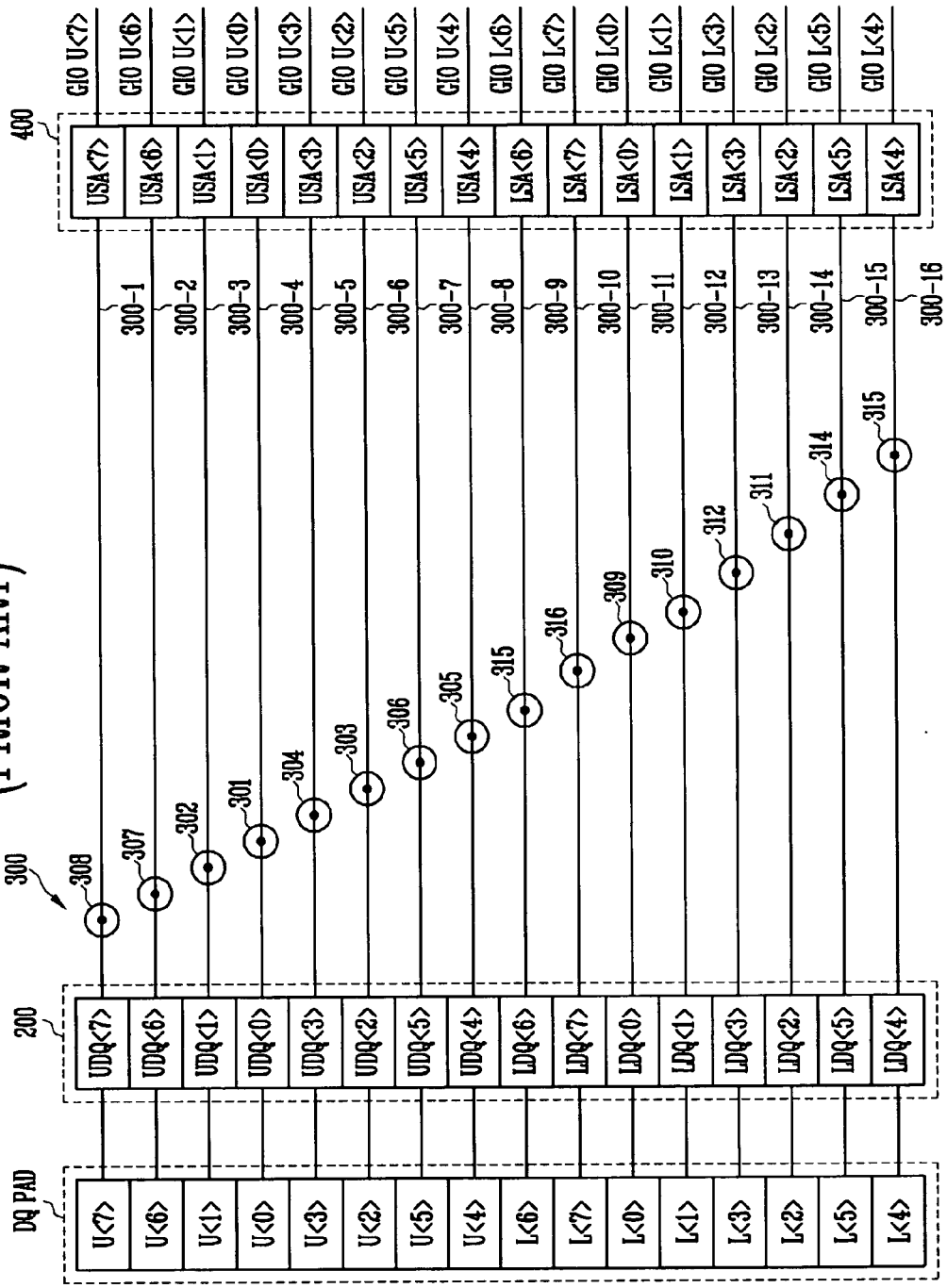
FIG. 4 is a block diagram of a semiconductor memory device having a scheme that multiplexes write data when a data width is X16.

Embodiments according to the present invention will now be described with reference to the accompanying drawings. Since the embodiments are provided for the purpose at allowing a person with ordinary skill in the art to be able to understand the present invention, the embodiments may be modified in various manners and the scope of the present invention is not limited by the embodiments described herein. Like reference numerals are used to identify the same or similar parts.

Figure 7:
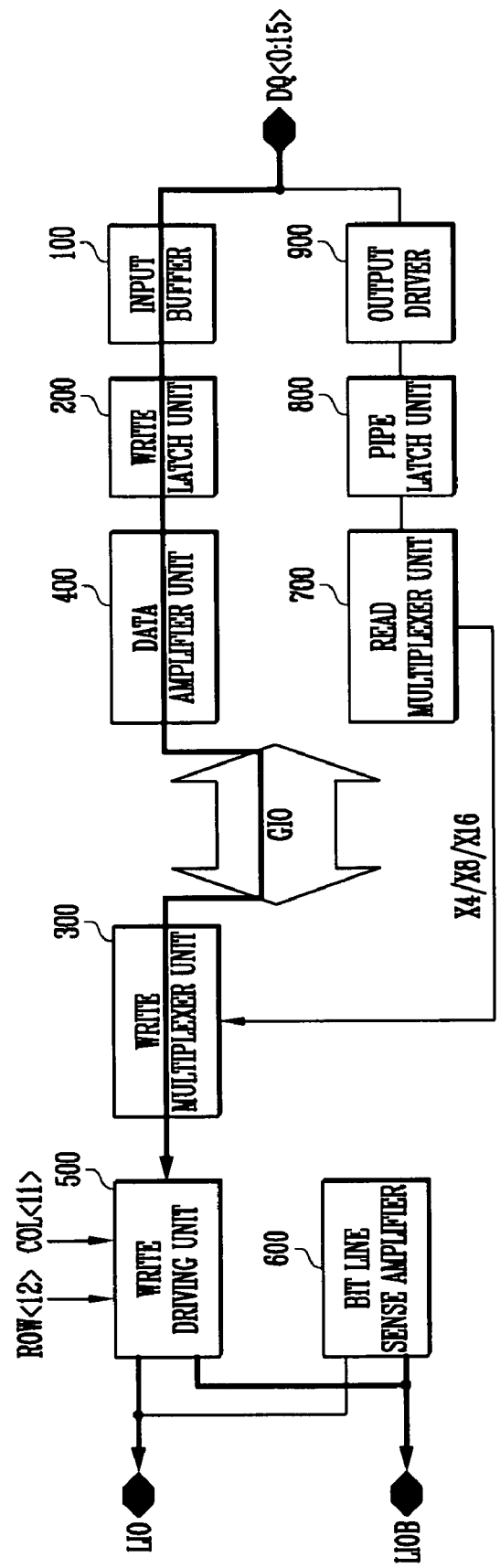
FIG. 7 is a block diagram of a semiconductor memory device having a scheme that multiplexes write data according to an embodiment of the present invention.

FIG. 7 is a block diagram showing a write path being a data input path according to an embodiment of the present invention.

Referring to FIG. 7, write data to be written into memory cells (not shown) are transmitted to a global I/O bus GIO through DQ pads DQ<0:15>, an input buffer 100, a write latch unit 200 and a data amplifier unit 400. A write multiplexer unit 300 multiplexes the write data transmitted to the global I/O bus GIO, and sends the multiplexed write data to a write driving unit 500 of a memory core region. The write driving unit 500 selectively operates according to a highest row address (ROW<12>; 256 Mb DDR2 SDRAM) and a column address COL<11>, and sends the write data received from the write multiplexer unit 300 to local I/O buses LIO and LIOB. The global I/O bus GIO is routed in the entire chip regardless of the position of the write multiplexer unit 300. The bit line sense amplifier 600, the read multiplexer unit 700, the pipe latch unit 800 and the output driver 900 are used to output data stored in the memory cells (not shown) to the outside through the I/O pads DQ<0:15>. Detailed description thereof will be omitted.

As shown in FIG. 7, the write multiplexer unit 300 is disposed right in front of the write driving unit 500 of the memory core region unlike the prior art.

Figure 8:
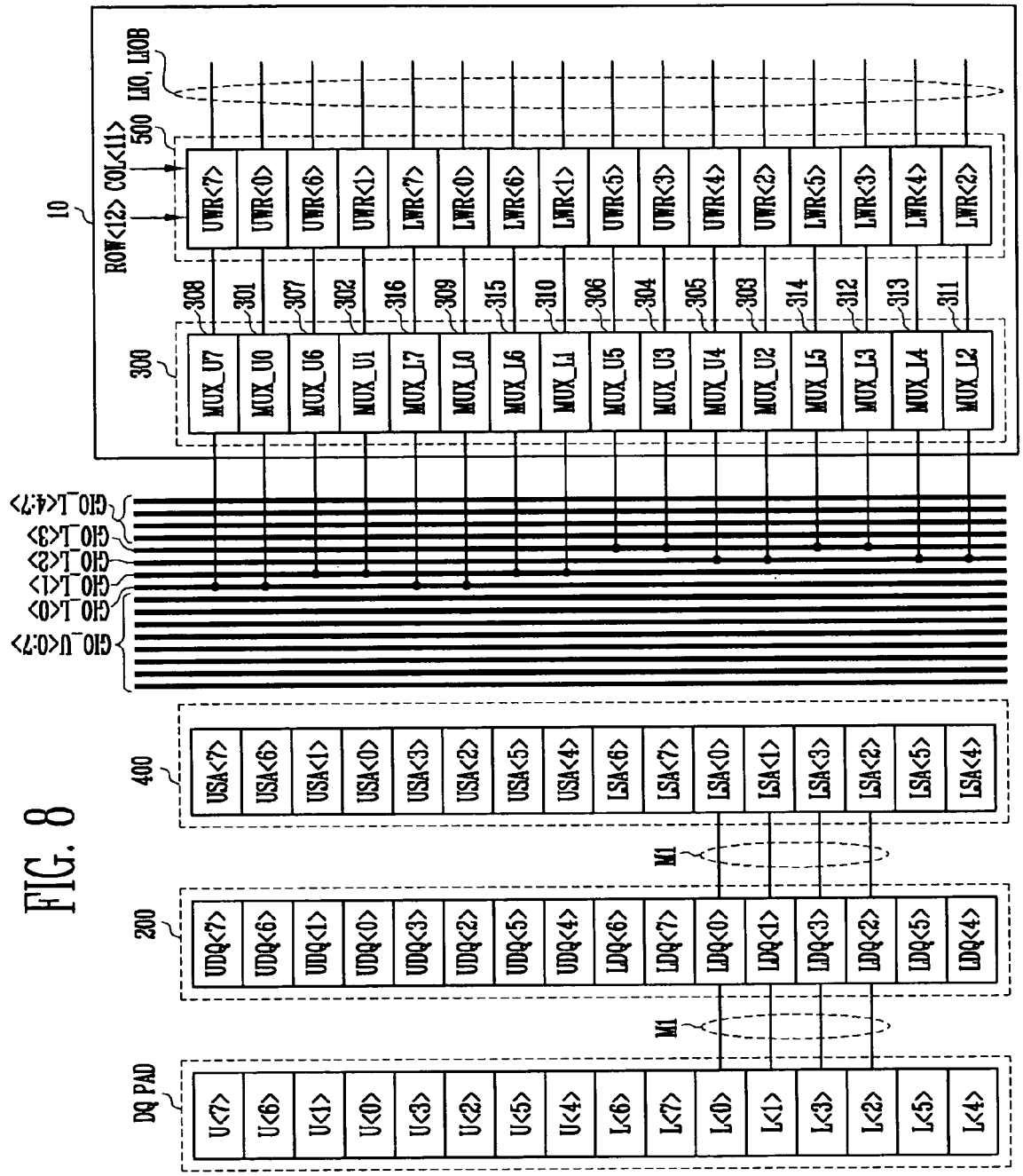
FIG. 8 is a block diagram of a semiconductor memory device having a scheme that multiplexes write data when a data width is X4.
Figure 9:
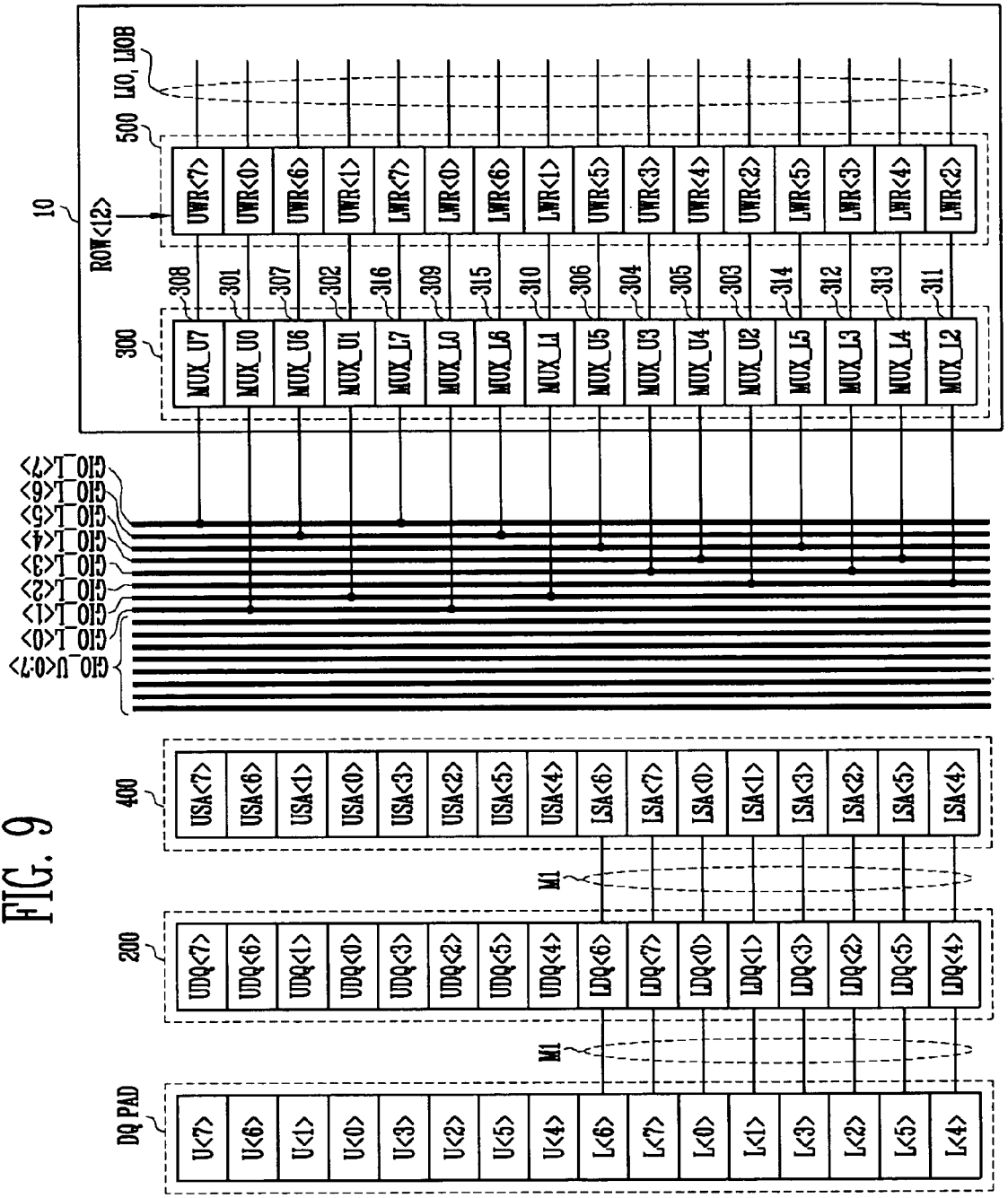
FIG. 9 is a block diagram of a semiconductor memory device having a scheme that multiplexes write data when a data width is X8.
Figure 10:
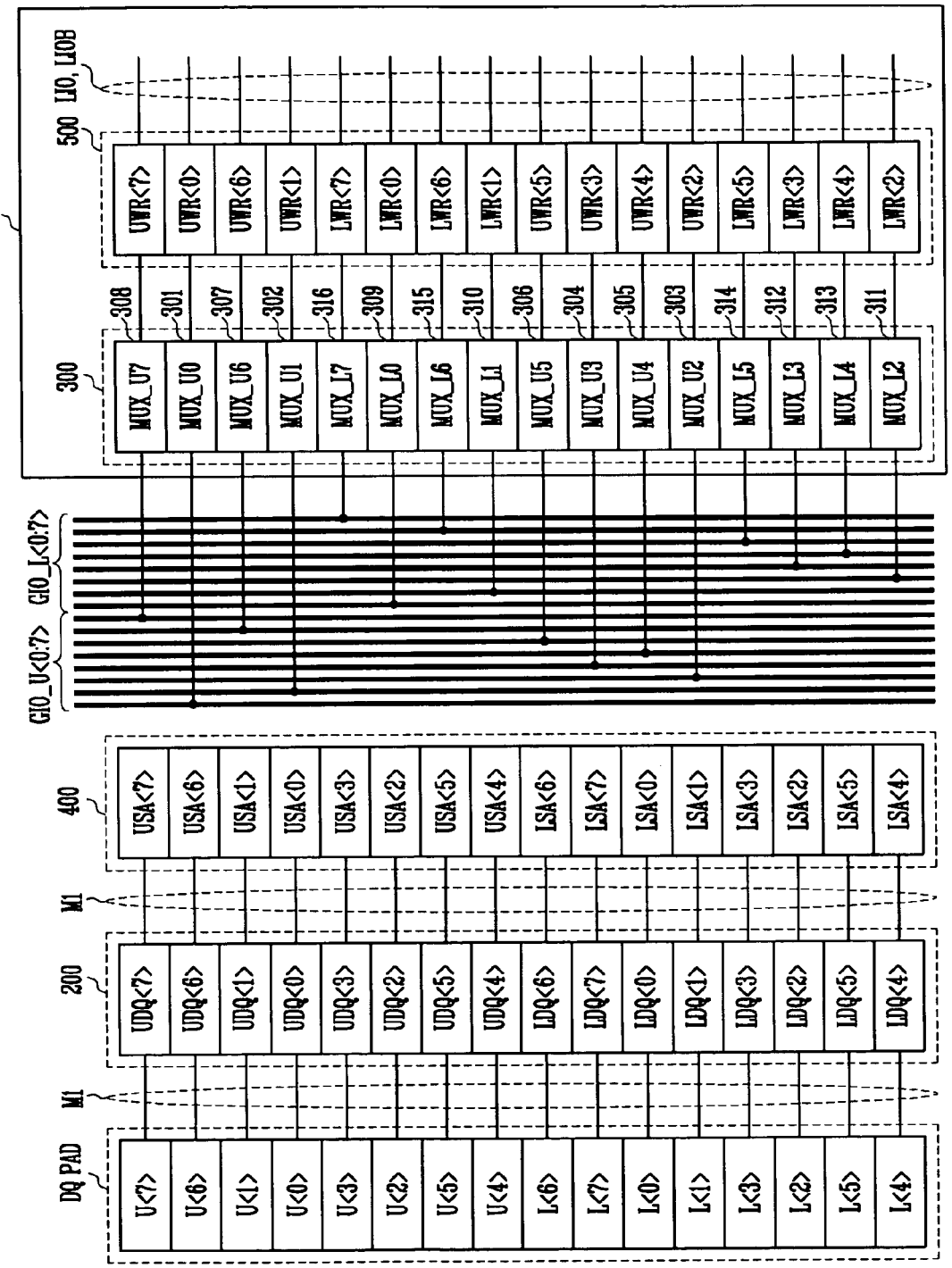
FIG. 10 is a block diagram of a semiconductor memory device having a scheme that multiplexes write data when a data width is X416.

FIGS. 8 to 10 are block diagrams showing a path along which write data input through the DQ pad, the write latch unit 200, the data amplifier unit 400 and the global I/O buses are multiplexed in the write multiplexer unit 300, and then output to the write driving unit 500.

Referring to FIGS. 8 to 10, the DQ pad receives sixteen write data bits U<0:7> and L<0:7>, and outputs the write data. The write latch unit 200 includes sixteen write latch circuits UDQ<0:7> and LDQ<0:7>. The write multiplexer unit 300 consists of sixteen write multiplexers 301 to 316. The data amplifier unit 400 has sixteen data I/O sense amplifiers USA<0:7> and LSA<0:7>. The write driving unit 500 is composed of sixteen write drivers UWR<0:7> and LWR<0:7>. At this time, the write multiplexer unit 300 is inclusive of the memory core region 10, and is disposed immediately in front of the write driving unit 500 unlike the prior art.

Points of the present invention, which are different from those of the prior art, will be first described in short. In the prior art, the DDR2 DRAM needs the 4×24=96 number of the second metal lines. Further, all the 4×16=6 number of the four data I/O sense amplifiers are driven regardless of the data widths X4, X8 and X16. In the present invention, however, in the case of a DDR2 DRAM, ninety-six second metal lines are not needed. In the case of a DDR2 DRAM, if a data width is X4, only a 4×4=16 number of the data I/O sense amplifiers are driven, and if the data width is X8, only a 4×8=32 number of the data I/O sense amplifiers are driven.

Furthermore, in the prior art, the data amplifier unit 400 determines into which memory cell will write data be written according to the highest row address (ROW<12>; 256 Mb DDR2 SDRAM) and the column address COL<11>. In the present invention, however, the write driving unit 500 determines into which memory cell will write data be written according to the highest row address ROW<12> and the column address COL<11>.

Figure 11A:
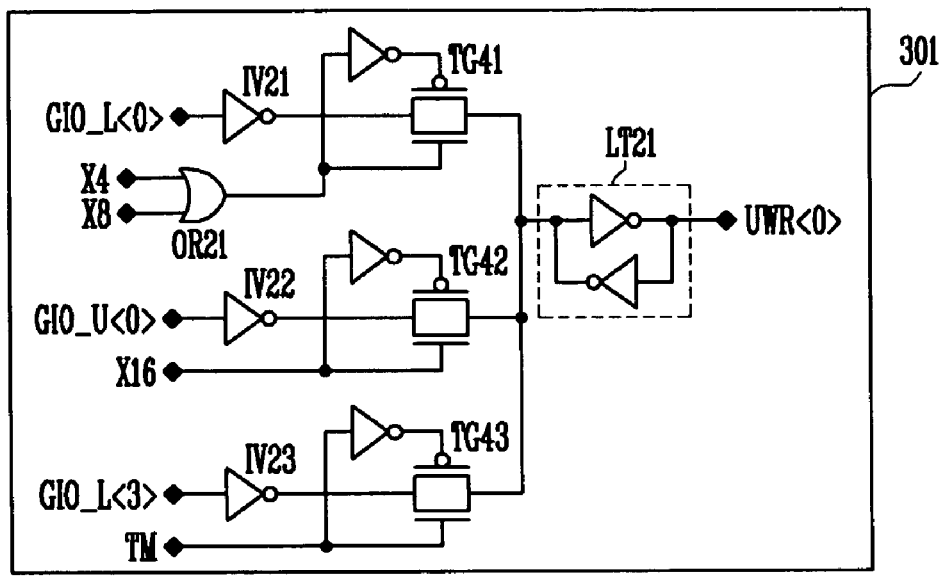
FIGS. 11A to 11P are circuit diagrams showing write multiplexer units of FIGS. 7 to 10.
Figure 11B:
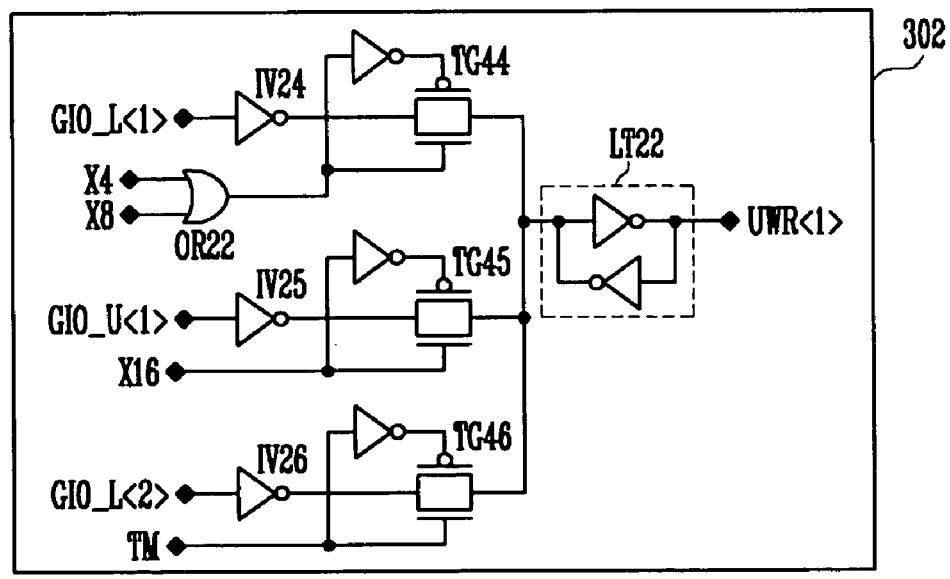
Figure 11C:
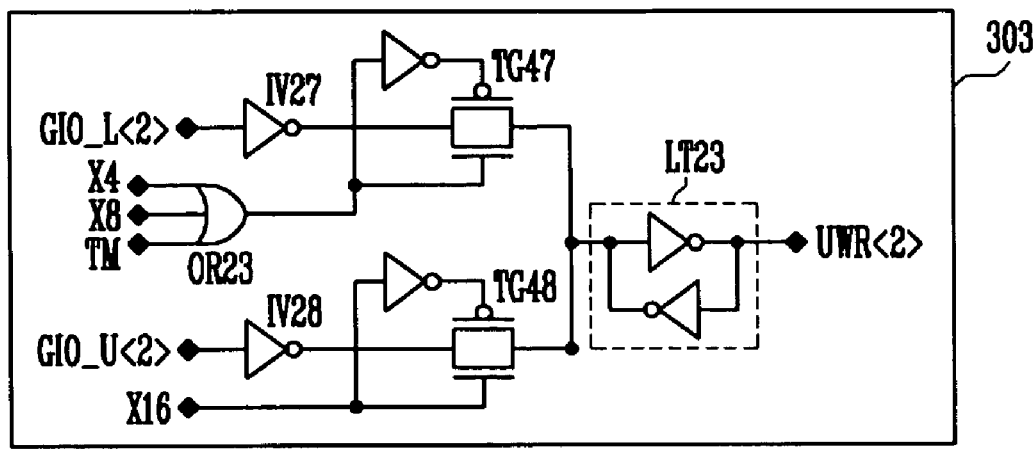
Figure 11D:
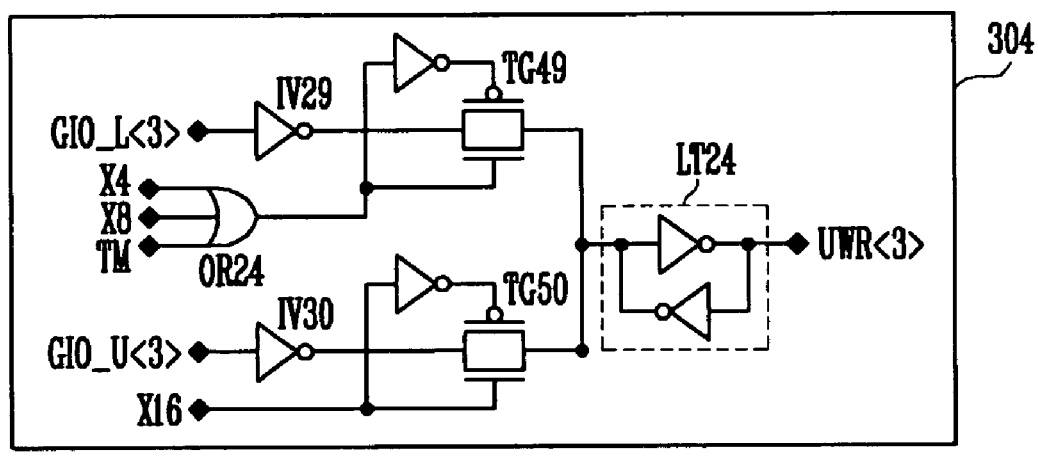
Figure 11E:
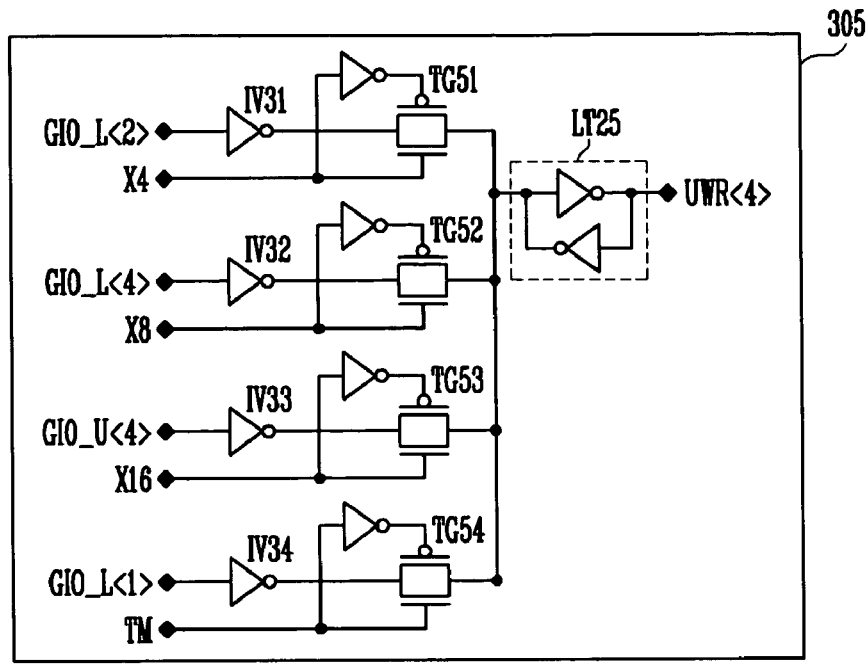
Figure 11F:
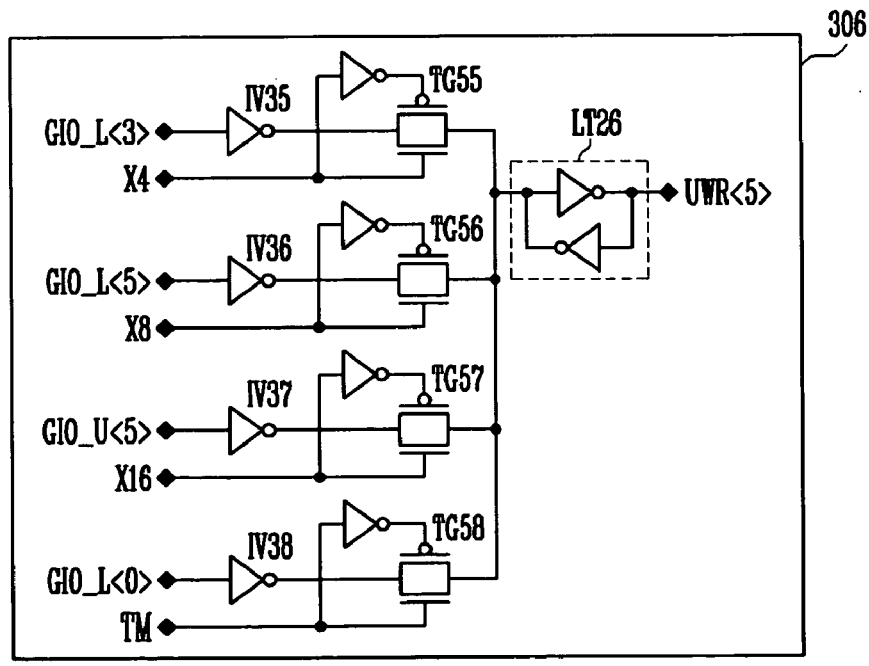
Figure 11G:
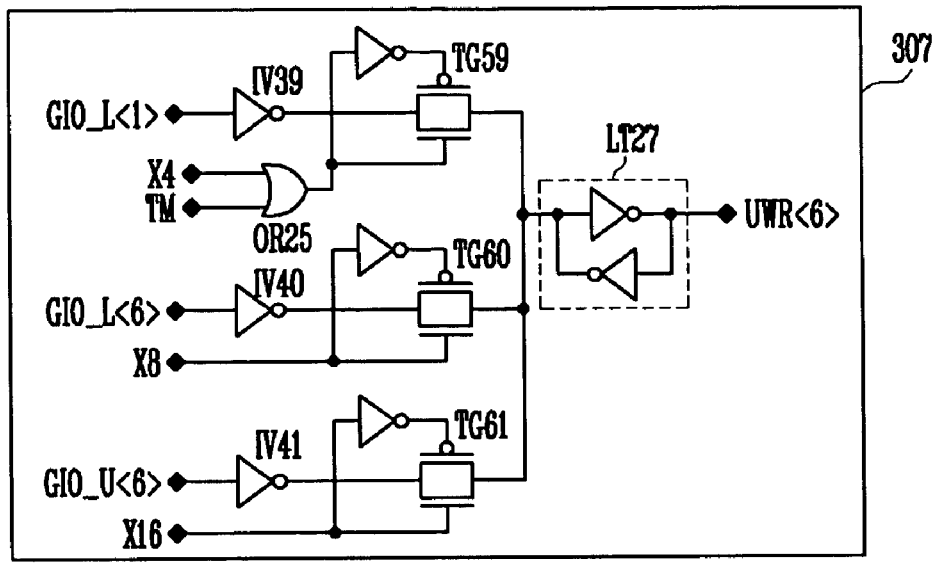
Figure 11H:
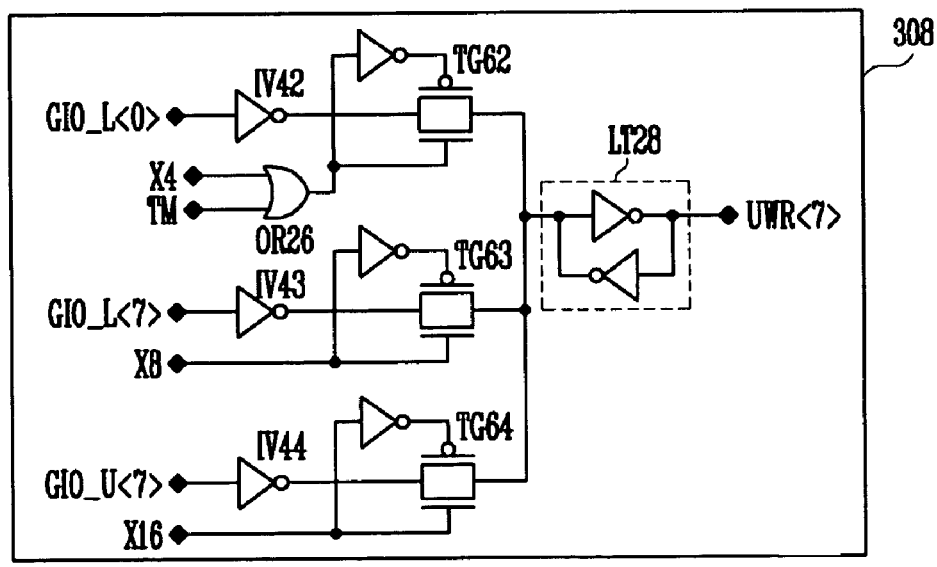
Figure 11I:
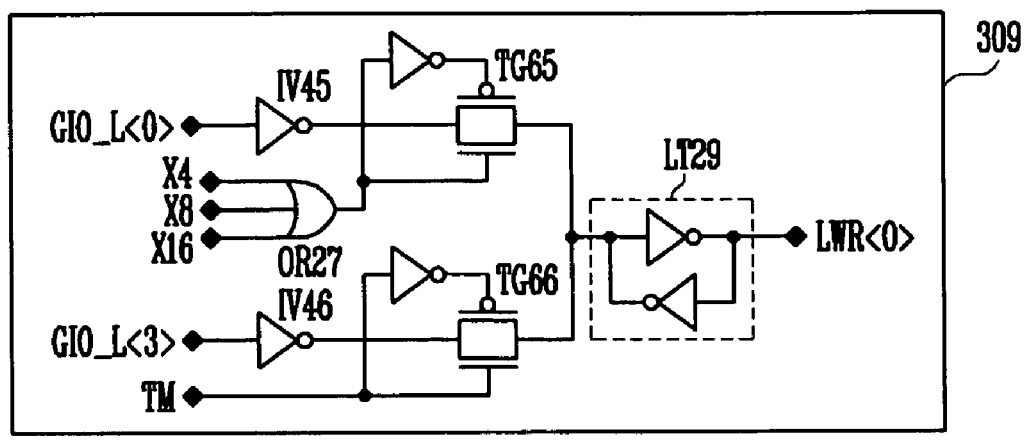
Figure 11J:
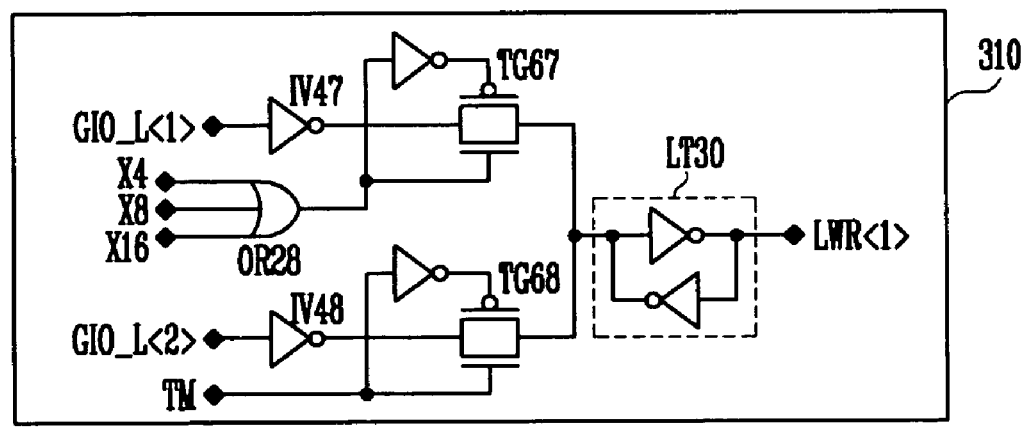
Figure 11K:
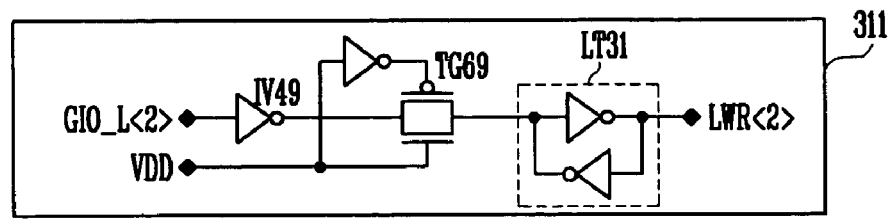
Figure 11L:
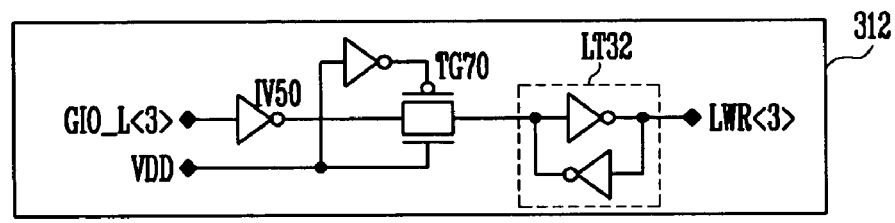
Figure 11M:
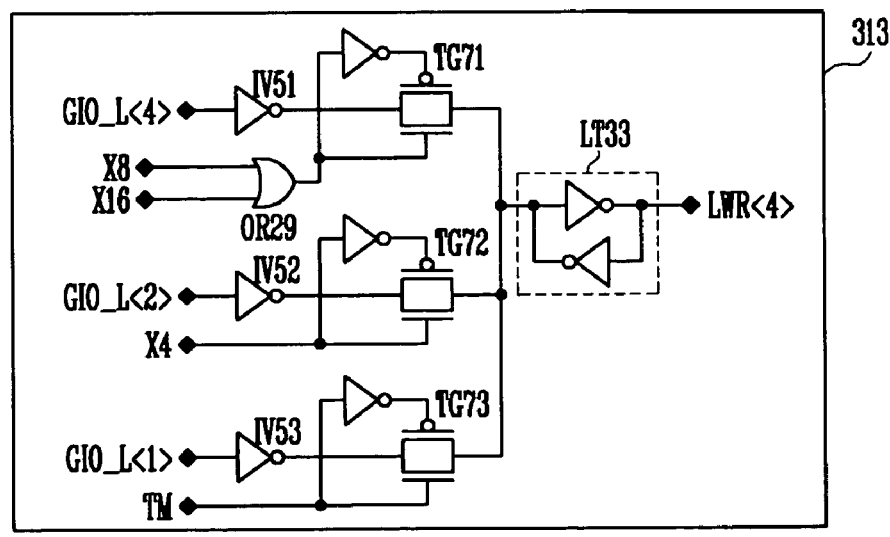
Figure 11N:
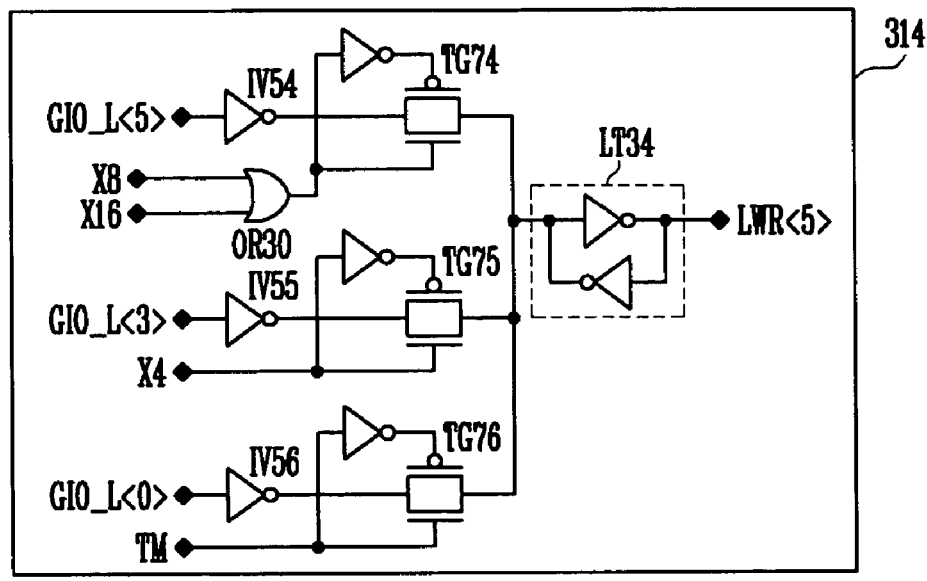
Figure 11O:
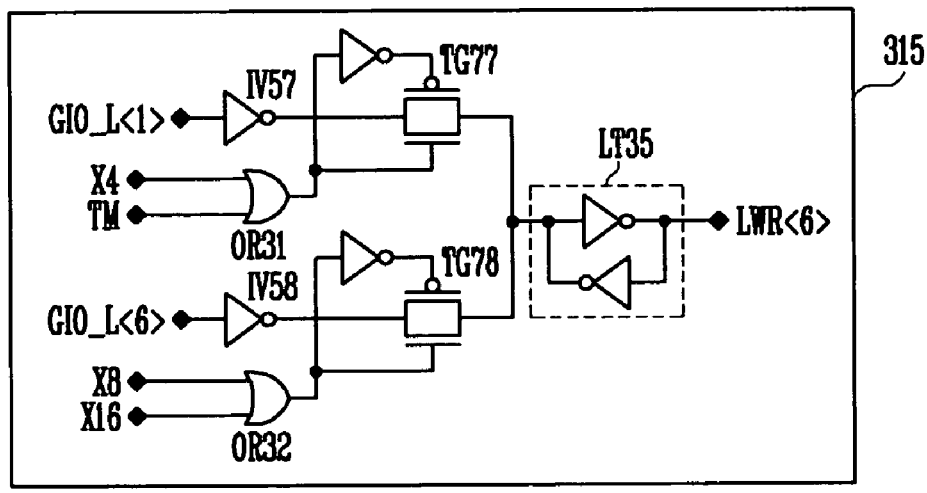
Figure 11P:
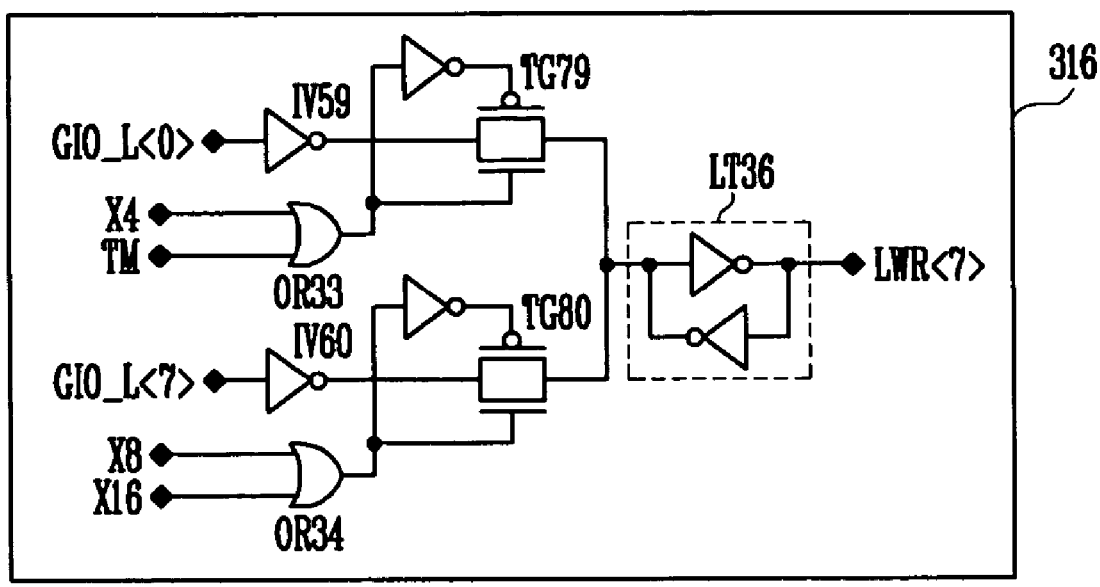

FIGS. 11A to 11P are detailed circuit diagrams of the write multiplexer units shown in FIGS. 8 to 10.

Figure 6A:
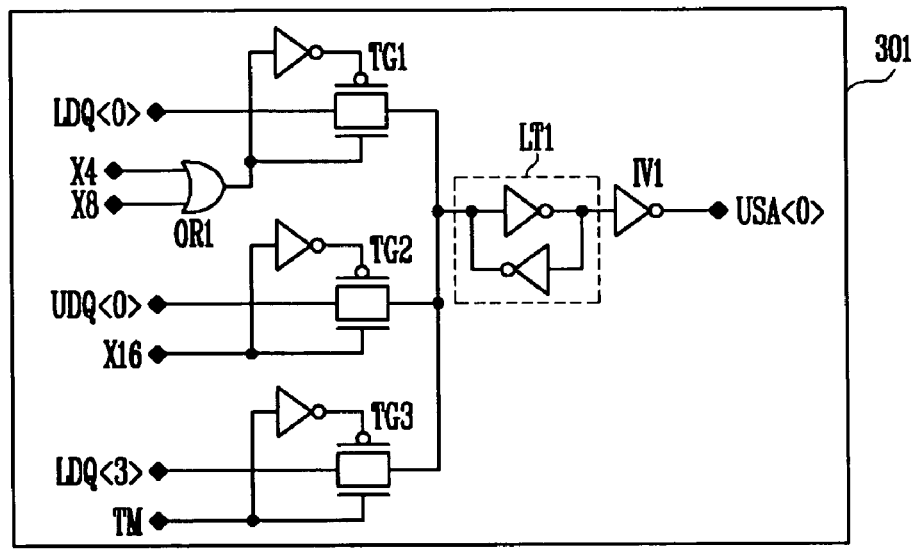
FIGS. 6A to 6P are circuit diagrams showing write multiplexer units of FIGS. 1 to 5.
Figure 6B:
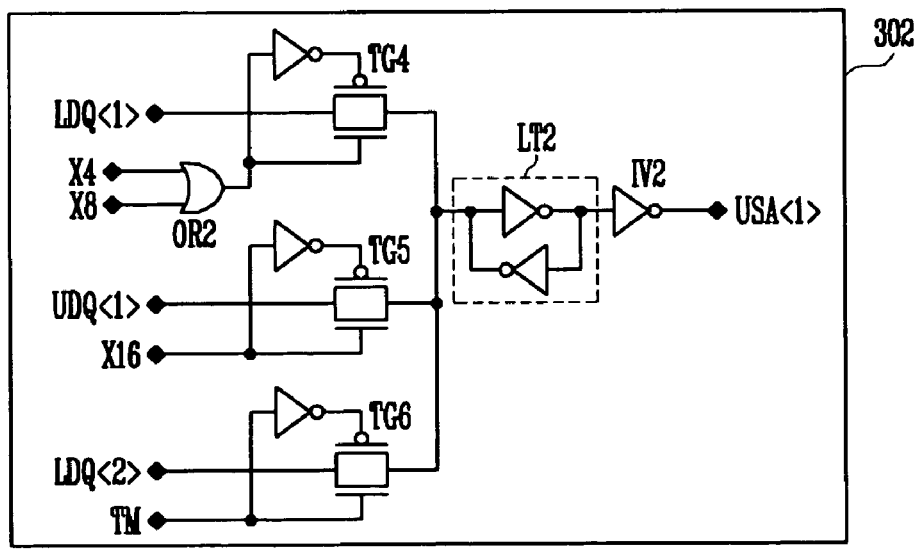
Figure 6C:
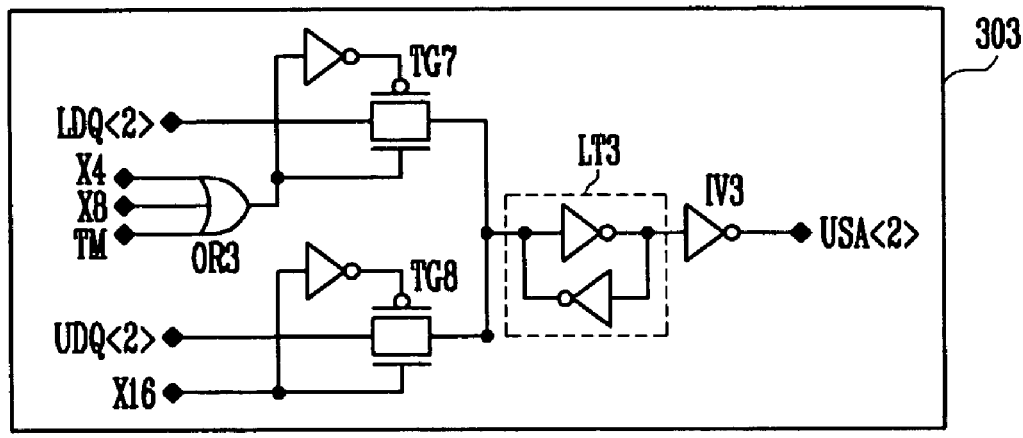
Figure 6D:
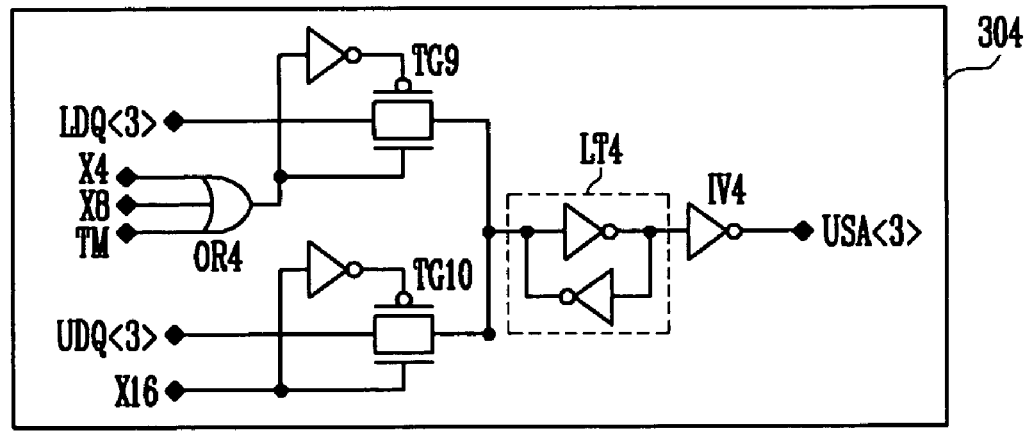
Figure 6E:
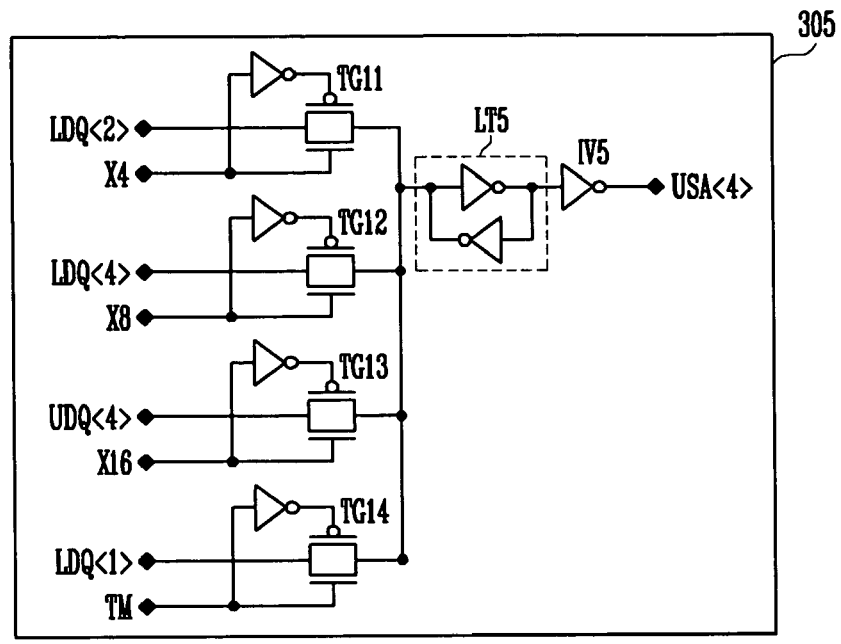
Figure 6F:
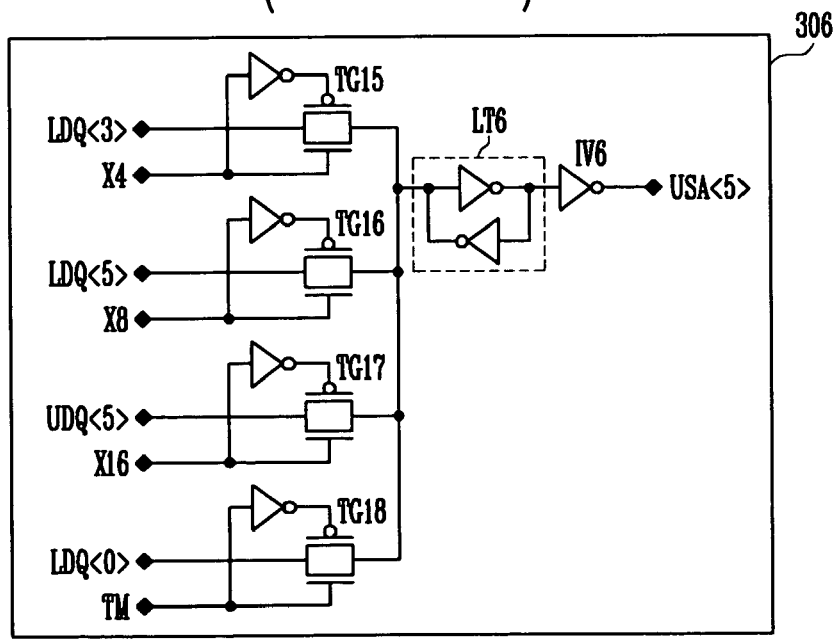
Figure 6G:
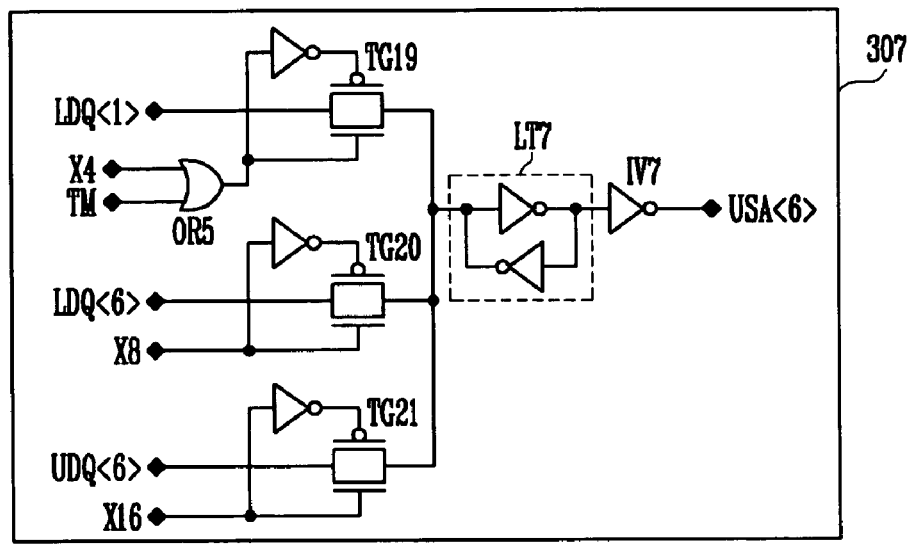
Figure 6H:
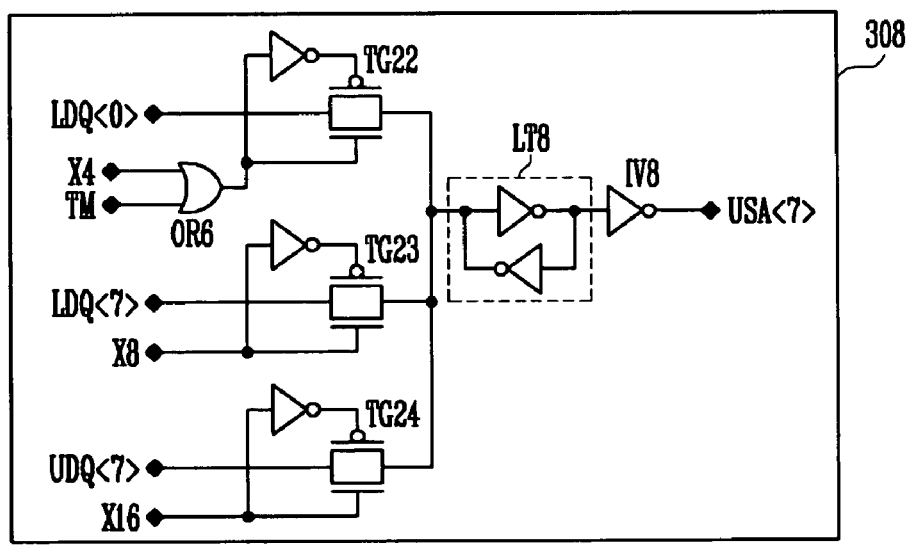
Figure 6I:
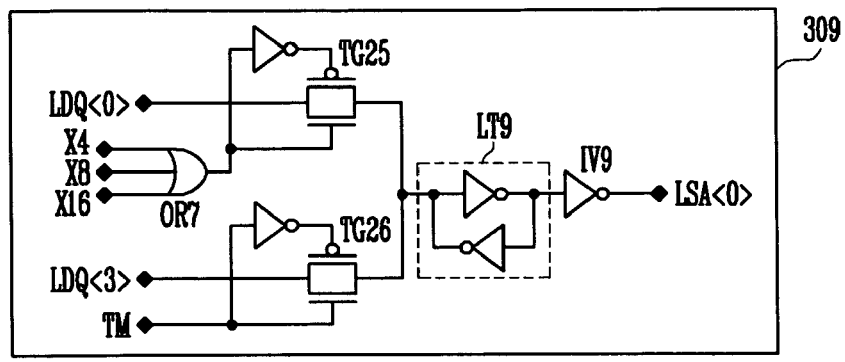
Figure 6J:
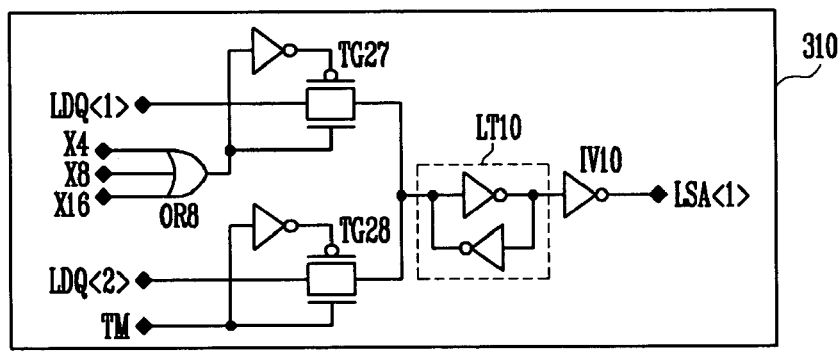
Figure 6K:
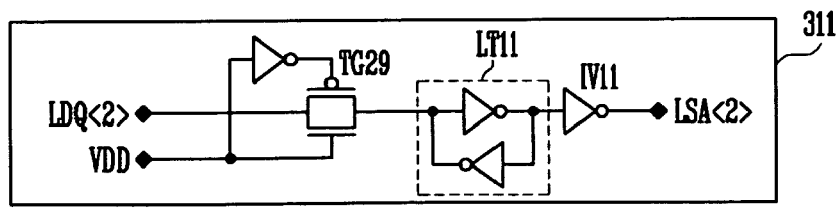
Figure 6L:
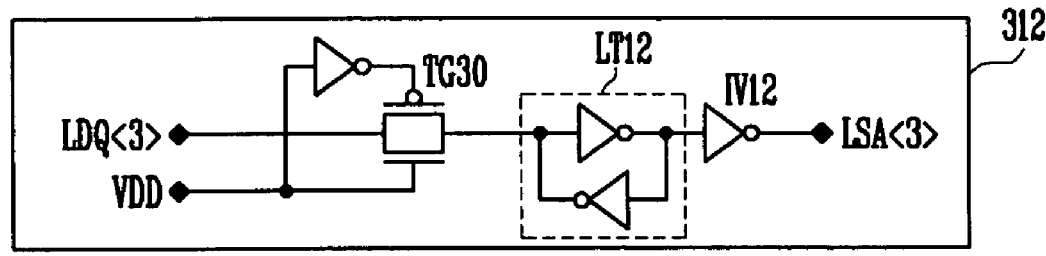
Figure 6M:
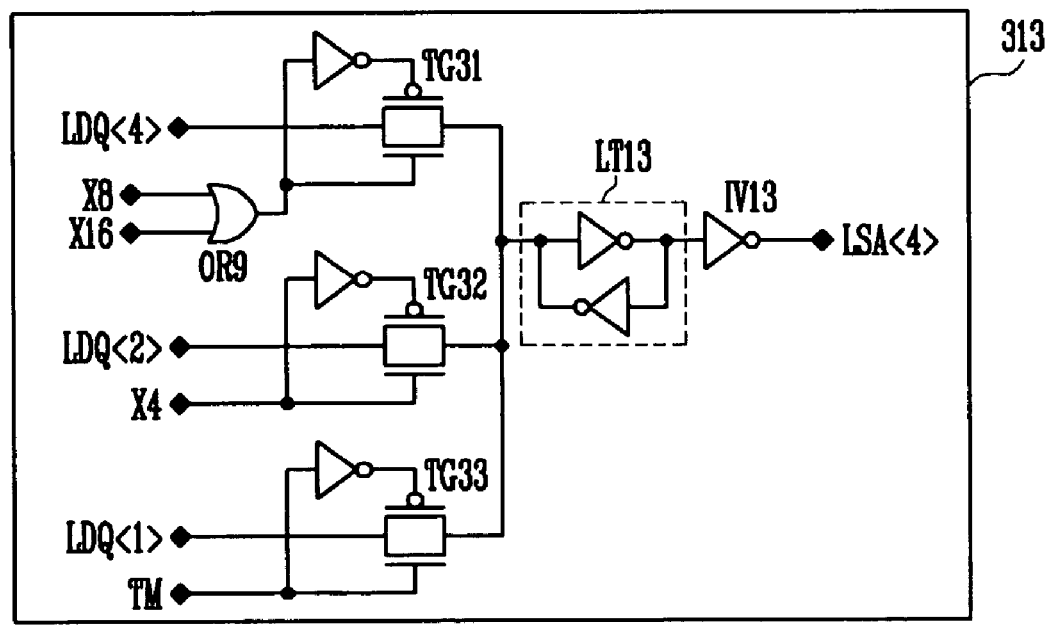
Figure 6N:
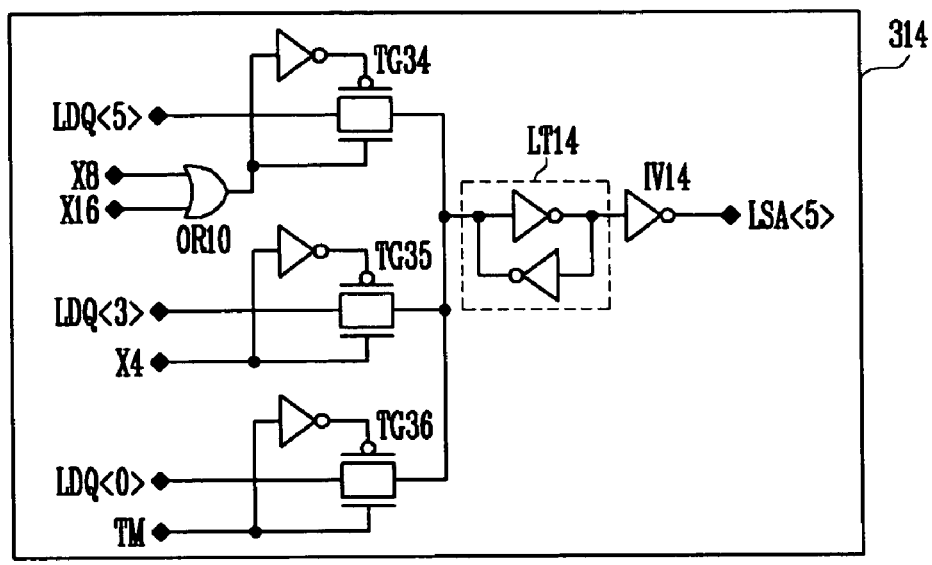
Figure 6O:
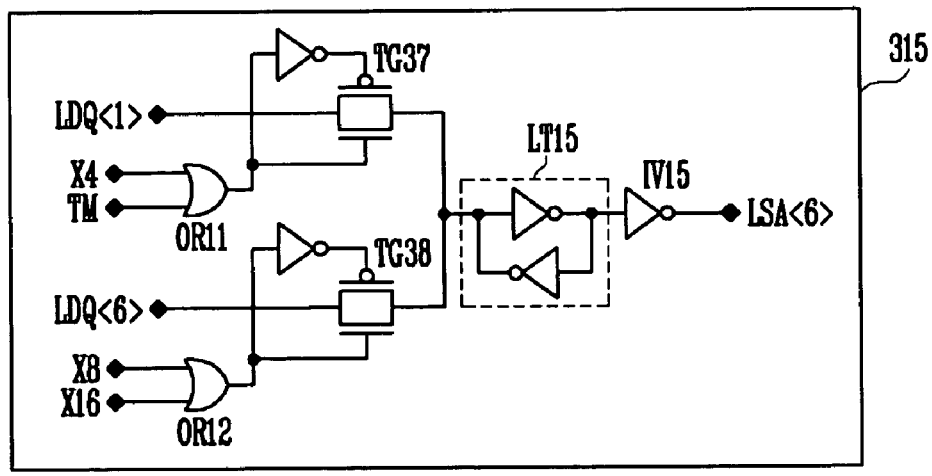
Figure 6P:
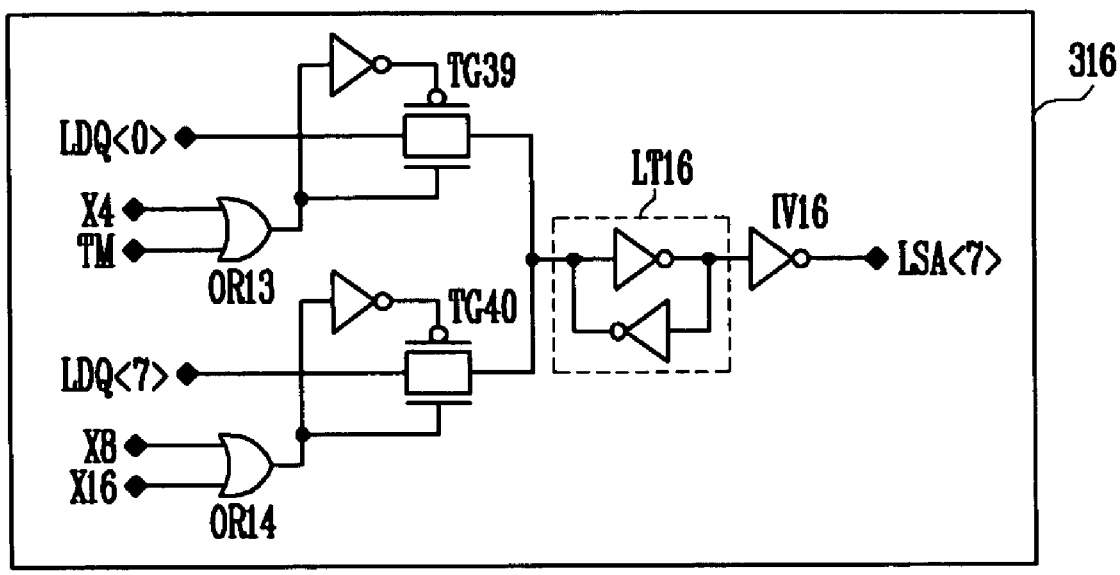

At this time, the write multiplexers shown in FIGS. 11A to 11P are different, in structure, from the write multiplexers shown in FIGS. 6A to 6P in that the inverters IV1 to IV16 are disposed in the output terminals of the write multiplexers shown in FIGS. 6A to 6P according to the prior art, whereas inverters IV21 to IV60 for inverting write data received from the global I/O buses GIO_L<0:7> and GIO_U<0:7> are disposed in the input terminals of the write multiplexers shown in FIGS. 11A to 11P according to the present invention. The reason why the inverters IV21 to IV60 are disposed in the input terminals of the write multiplexers is for reducing loading of the global I/O buses GIO_L<0:7> and GIO_U<0:7>. If the inverters IV21 to IV60 do not exist, the global I/O buses GIO_L<0:7> and GIO_U<0:7> uses the front end of latches LT21 to LT36 through the transfer gates TG41 to TG80 as a data loading path. If the inverters IV21 to IV60 exist, the global I/O buses GIO_L<0:7> and GIO_U<0:7> use only up to the front end of the inverters IV21 to IV60 as the data loading path. Thus, loading of the global I/O buses GIO_L<0:7> and GIO_U<0:7> can be reduced.

A preferred embodiment of the present invention will now be described with reference to FIGS. 8 to 11A to 11P.

FIG. 8 is a view showing the operation of the write multiplexer unit 300 when the data width is X4.

Referring to FIG. 8, write data bits L<0:3> input through four I/O pads among DQ pads are transmitted to four write latch circuits LDQ<0:3> through four first metal lines M1 that correspond to each other one to one. The four write latch circuits LDQ<0:3> transmit the received four write data bits L<0:3> to four data I/O sense amplifiers LSA<0:3> through the four first metal lines M1. The data I/O sense amplifiers LSA<0:3> transmit the write data bits L<0:3> to the global I/O buses GIO_L<0:3>. The write multiplexers 301 to 316 multiplex the four write data bits received from the global I/O buses GIO_L<0:3> into 16, and transmit the multiplexed write data to the write drivers UWR<0:7> and LWR<0:7>. The write drivers UWR<0:7> and LWR<0:7> select only data that will be written into memory cells according to the highest row address ROW<12> and the column address COL<11>, and then send the selected write data to the local I/O buses LIO and LIOB.

Next, a scheme in which the four write data bits L<0:3> received through the four global I/O bus GIO_L<0:3> are multiplexed into 16 through the write multiplexers 301 to 316, and are then transmitted to the sixteen write drivers UWR<0:7> and LWR<0:7> when the data width is X4 will be described with reference to FIGS. 8 and 11A to 11P.

First, if the write data bits L<0> transmitted to the global I/O bus GIO_L<0> are input to the write multiplexer 301 shown in FIG. 11A, and the transfer gate TG41 is thus turned on according to a signal X4, the write data bits L<0> are transmitted to the write driver UWR<0>. If the write data bits L<0> are input to the write multiplexer 308 shown in FIG. 11H, and the transfer gate TG62 is thus turned on according to the signal X4, the write data bits L<0> are transmitted to the write driver UWR<7>. Further, if the write data bits L<0> are input to the write multiplexer 309 shown in FIG. 11I, and the transfer gate TG65 is thus turned on according to the signal X, the write data bits L<0> are transmitted to the write driver LWR<0>. Lastly, if the write data bits L<0> are input to the write multiplexer 316 shown in FIG. 11P, and the transfer gate TG79 is thus turned on according to the signal X4, the write data bits L<0> are transmitted to the write driver LWR<7>.

Second, if the write data bits L<1> transmitted to the global I/O bus GIO_L<1> are input to the write multiplexer 302 shown in FIG. 11B, and the transfer gate TG44 is thus turned on according to a signal X4, the write data bits L<1> are transmitted to the write driver UWR<1>. If the write databits L<1> are input to the write multiplexer 307 shown in FIG. 11G, and the transfer gate TG59 is thus turned on according to the signal X4, the write data bits L<1> are transmitted to the write driver UWR<6>. Further, if the write data bits L<1> are input to the write multiplexer 310 shown in FIG. 11J, and the transfer gate TG67 is thus turned on according to the signal X4, the write data bits L<1> are transmitted to the write driver LWR<1>. Lastly, if the write data bits L<1> are input to the write multiplexer 315 shown in FIG. 10, and the transfer gate TG77 is thus turned on according to the signal X4, the write data bits L<1> are transmitted to the write driver LWR<6>.

Third, if the write data bits L<2> transmitted to the global I/O bus GIO_L<2> are input to the write multiplexer 303 shown in FIG. 11C, and the transfer gate TG47 is thus turned on according to a signal X4, the write data bits L<2> are transmitted to the write driver UWR<2>. If the write data bits L<2> are input to the write multiplexer 305 shown in FIG. 11E, and the transfer gate TG51 is thus turned on according to the signal X4, the write data bits L<2> are transmitted to the write driver UWR<4>. Further, the write data bits L<2> are input to the write multiplexer 311 shown in FIG. 11K, and are then transmitted to the write driver LWR<2> through the transfer gate TG69, which is always turned on by means of the power supply voltage VDD. Lastly, if the write data bits L<2> are input to the write multiplexer 313 shown in FIG. 11M, and the transfer gate TG72 is thus turned on according to the signal X4, the write data bits L<2> are transmitted to the write driver UWR<4>.

Fourth, if the write data bits L<3> transmitted to the global I/O bus GIO_L<3> are input to the write multiplexer 304 shown in FIG. 11D, and the transfer gate TG49 is thus turned on according to a signal X4, the write data bits L<3> are transmitted to the write driver UWR<3>. If the write data bits L<3> are input to the write multiplexer 306 shown in FIG. 11F, and the transfer gate TG55 is thus turned on according to the signal X4, the write data bits L<3> are transmitted to the write driver UWR<5>. Further, the write data bits L<3> are input to the write multiplexer 312 shown in FIG. 11L, and are then transmitted to the write driver LWR<3> through the transfer gate TG70, which is always turned on by means of the power supply voltage VDD. Lastly, if the write data bits L<3> are input to the write multiplexer 314 shown in FIG. 11N, and the transfer gate TG75 is thus turned on according to the signal X4, the write data bits L<3> are transmitted to the write driver UWR<5>.

As described above, if the write data bits L<0:3> received through the DQ pads are all input to the sixteen write drivers UWR<0:7> and LWR<0:7> through the write latch circuits LDQ<0:3>, the data I/O sense amplifiers LSA<0:3>, the global I/O buses GIO_U<0:3>, the global I/O buses GIO_L<0:3> and the write multiplexers 301 to 316, only four of the write drivers UWR<0:7> and LWR<0:7> operate according to the highest row address ROW<12> and the column address COL<11> to transfer only four write data to the local I/O buses LIO and LIOB.

This will be described in more detail. If the highest row address ROW<12> is 0 and the column address COL<11> is 0, four write drivers UWR<4:7> operate to transfer only four write data bits to the local I/O buses LIO and LIOB. If the highest row address ROW<12> is 0 and the column address COL<11> is 1, four write drivers UWR<0:3> operate to transfer only four write data bits to the local I/O buses LIO and LIOB. If the highest row address ROW<12> is 1 and the column address COL<11> is 0, four write drivers LWR<4:7> operate to transfer only four write data bits to the local I/O buses LIO and LIOB. If the highest row address ROW<12> is 1 and the column address COL<11> is 1, four write drivers LWR<0:3> operate to transfer only four write data bits to the local I/O buses LIO and LIOB.

FIG. 8 is a view showing the operation of the write multiplexer unit 300 when the data width is X8.

Referring to FIG. 9, eight write data bits L<0:7> received through eight DQ pads are transmitted to eight write latch circuits LDQ<0:7> through eight first metal lines M1 that correspond to each other. The write latch circuits LDQ<0:7> transmit the received eight write data bits L<0:7> to eight data I/O sense amplifiers LSA<0:7> through the eight first metal lines M1 that correspond to each other. The data I/O sense amplifiers LSA<0:7> transmit the eight write data bits L<0:7> to eight global I/O buses GIO_L<0:7>. The write multiplexers 301 to 316 multiplex the eight write data bits received from the global I/O buses GIO_L<0:7> into 16, and transmit the multiplexed write data bits to write drivers UWR<0:7> and LWR<0:7>. The write drivers UWR<0:7> and LWR<0:7> select only write data bits that will be written into memory cells according to a highest row address ROW<12>, and send the selected write data to the local I/O buses LIO and LIOB.

A scheme in which the eight write data bits L<0:7> received through the eight global I/O bus GIO_L<0:7> are multiplexed into 16 through the write multiplexers 301 to 316, and are then transmitted to the sixteen write drivers UWR<0:7> and LWR<0:7> when the data width is X8 will be then described with reference to FIGS. 9 and 11A to 11P.

First, if the write data bits L<0> transmitted to the global I/O bus GIO_L<0> are input to the write multiplexer 301 shown in FIG. 1A, and the transfer gate TG41 is thus turned on according to a signal X8, the write data bits L<0> are transmitted to the write driver UWR<0>. Further, if the write data bits L<0> are input to the write multiplexer 309 shown in FIG. 11I, and the transfer gate TG65 is thus turned on according to the signal X8, the write data bits L<0> are transmitted to the write driver UWR<0>.

Second, if the write data bits L<1> transmitted to the global I/O bus GIO_L<1> are input to the write multiplexer 302 shown in FIG. 11B, and the transfer gate TG44 is thus turned on according to a signal X8, the write data bits L<1> are transmitted to the write driver UWR<1>. Further, if the write data bits L<1> are input to the write multiplexer 310 shown in FIG. 11J, and the transfer gate TG67 is thus turned on according to the signal X8, the write data bits L<1> are transmitted to the write driver LWR<1>.

Third, if the write data bits L<2> transmitted to the global I/O bus GIO_L<2> are input to the write multiplexer 303 shown in FIG. 11C, and the transfer gate TG47 is thus turned on according to a signal X8, the write data bits L<2> are transmitted to the write driver UWR<2>. Further, the write data bits L<2> are input to the write multiplexer 311 shown in FIG. 11K, and are then transmitted to the write driver LWR<2> through the transfer gate TG69, which is always turned on.

Fourth, if the write data bits L<3> transmitted to the global I/O bus GIO_L<3> are input to the write multiplexer 304 shown in FIG. 11D, and the transfer gate TG49 is thus turned on according to a signal X8, the write data bits L<3> are transmitted to the write driver UWR<3>. Further, the write data bits L<3> are input to the write multiplexer 312 shown in FIG. 11L, and are then transmitted to the write driver LWR<3> through the transfer gate TG70, which is always turned on.

Fifth, if the write data bits L<4> transmitted to the global I/O bus GIO_L<4> are input to the write multiplexer 305 shown in FIG. 11E, and the transfer gate TG52 is thus turned on according to a signal X8, the write data bits L<4> are transmitted to the write driver UWR<4>. Further, if the write data bits L<4> are input to the write multiplexer 313 shown in FIG. 11M, and the transfer gate TG71 is thus turned on according to the signal X8, the write data bits L<4> are transmitted to the write driver LWR<4>.

Sixth, if the write data bits L<5> transmitted to the global I/O bus GIO_L<5> are input to the write multiplexer 306 shown in FIG. 11F, and the transfer gate TG56 is thus turned on according to a signal X8, the write data bits L<5> are transmitted to the write driver UWR<5>. Further, if the write data bits L<5> are input to the write multiplexer 314 shown in FIG. 11N, and the transfer gate TG74 is thus turned on according to the signal X8, the write data bits L<5> are transmitted to the write driver LWR<5>.

Seventh, if the write data bits L<6> transmitted to the global I/O bus GIO_L<6> are input to the write multiplexer 307 shown in FIG. 11G, and the transfer gate TG60 is thus turned on according to a signal X8, the write data bits L<6> are transmitted to the write driver UWR<6>. Further, if the write data bits L<6> are input to the write multiplexer 315 shown in FIG. 11O, and the transfer gate TG78 is thus turned on according to the signal X8, the write data bits L<6> are transmitted to the write driver LWR<6>.

Eighth, if the write data bits L<7> transmitted to the global I/O bus GIO_L<7> are input to the write multiplexer 308 shown in FIG. 11H, and the transfer gate TG63 is thus turned on according to a signal X8, the write data bits L<7> are transmitted to the write driver UWR<7>. Further, if the write data bits L<7> are input to the write multiplexer 316 shown in FIG. 11P, and the transfer gate TG80 is thus turned on according to the signal X8, the write data bits L<7> are transmitted to the write driver LWR<7>.

As described above, if the write data bits L<0:7> input through the DQ pad are all input to the sixteen write drivers UWR<0:7> and LWR<0:7> through the write latch circuits LDQ<0:7>, the data I/O sense amplifiers LSA<0:7>, the global I/O buses GIO_U<0:7> and the write multiplexers 301 to 316, only eight of the write drivers UWR<0:7> and LWR<0:7> operates according to he highest row address ROW<12> to transfer only eight write data bits to the local I/O buses LIO and LIOB.

This will be described in more detail. If the highest row address ROW<12> is 0, only the eight write drivers UWR<0:7> operate to transfer only the eight write data bits output from the write drivers UWR<0:7> to the local I/O buses LIO and LIOB. If the highest row address ROW<12> is 1, only the eight write drivers LWR<0:7> operate to transfer only the eight write data bits output from the write drivers LWR<0:7> to the local I/O buses LIO and LIOB.

FIG. 10 is a view showing the operation of the write multiplexer unit 300 when the data width is X16.

Referring to FIG. 10, sixteen write data bits U<0:7> and L<0:7> received through DQ pads are transmitted to sixteen write latch circuits UDQ<0:7> and LDQ<0:7> through sixteen first metal lines M1 that correspond to each other. The write latch circuits UDQ<0:7> and LDQ<0:7> transmit the received sixteen write data bits U<0:7> and L<0:7> to sixteen data I/O sense amplifiers USA<0:7> and LSA<0:7> through sixteen first metal lines M1 that correspond to each other. The data I/O sense amplifiers USA<0:7> and LSA<0:7> transmit the sixteen write data bits U<0:7> and L<0:7> to sixteen global I/O buses GIO_U<0:7> and GIO_L<0:7>. Write multiplexers 301 to 316 multiplex the sixteen write data received from the global I/O buses GIO_U<0:7> and GIO_L<0:7>, and send the multiplexed write data to sixteen write drivers UWR<0:7> and LWR<0:7>.

A scheme in which the sixteen write data bits U<0:7> and L<0:7> received through the eight global I/O bus GIO_U<0:7> and GIO_L<0:7> are multiplexed into 16 through the write multiplexers 301 to 316, and are then transmitted to the sixteen write drivers UWR<0:7> and LWR<0:7> when the data width is X16 will be then described with reference to FIGS. 10 and 11A to 11P.

First, if the write data bits U<0> transmitted to the global I/O bus GIO_U<0> are input to the write multiplexer 301 shown in FIG. 11A, and the transfer gate TG42 is thus turned on according to a signal X16, the write data bits U<0> are transmitted to the write driver UWR<0>.

Second, if the write data bits U<1> transmitted to the global I/O bus GIO_U<1> are input to the write multiplexer 302 shown in FIG. 11B, and the transfer gate TG45 is thus turned on according to a signal X16, the write data bits U<1> are transmitted to the write driver UWR<1>.

Third, if the write data bits U<2> transmitted to the global I/O bus GIO_U<2> are input to the write multiplexer 303 shown in FIG. 11C, and the transfer gate TG48 is thus turned on according to a signal X16, the write data bits U<2> are transmitted to the write driver UWR<2>.

Fourth, if the write data bits U<3> transmitted to the global I/O bus GIO_U<3> are input to the write multiplexer 304 shown in FIG. 11D, and the transfer gate TG50 is thus turned on according to a signal X16, the write data bits U<3> are transmitted to the write driver UWR<3>.

Fifth, if the write data bits U<4> transmitted to the global I/O bus GIO_U<4> are input to the write multiplexer 305 shown in FIG. 11E, and the transfer gate TG53 is thus turned on according to a signal X16, the write data bits U<4> are transmitted to the write driver UWR<4>.

Sixth, if the write data bits U<5> transmitted to the global I/O bus GIO_U<5> are input to the write multiplexer 306 shown in FIG. 11F, and the transfer gate TG57 is thus turned on according to a signal X16, the write data bits U<5> are transmitted to the write driver UWR<5>.

Seventh, if the write data bits U<6> transmitted to the global I/O bus GIO_U<6> are input to the write multiplexer 307 shown in FIG. 11G, and the transfer gate TG61 is thus turned on according to a signal X16, the write data bits U<6> are transmitted to the write driver UWR<6>.

Eighth, if the write data bits U<7> transmitted to the global I/O bus GIO_U<7> are input to the write multiplexer 308 shown in FIG. 11H, and the transfer gate TG64 is thus turned on according to a signal X16, the write data bits U<7> are transmitted to the write driver UWR<7>.

Ninth, if the write data bits L<0> transmitted to the global I/O bus GIO_L<0> are input to the write multiplexer 309 shown in FIG. 11I, and the transfer gate TG65 is thus turned on according to the X16, the write data bits L<0> are transmitted to the write driver LWR<0>.

Tenth, if the write data bits L<1> transmitted to the global I/O bus GIO_L<1> are input to the write multiplexer 310 shown in FIG. 11J, and the transfer gate TG67 is thus turned on according to the X16, the write data bits L<1> are transmitted to the write driver LWR<1>.

Eleventh, the write data bits L<2> transmitted to the global I/O bus GIO_L<2> are input to the write multiplexer 311 shown in FIG. 11K, and are then transmitted to the write driver LWR<2> through the transfer gate TG69, which is always turned on by the power supply voltage VDD.

Twelfth, the write data bits L<3> transmitted to the global I/O bus GIO_L<3> are input to the write multiplexer 312 shown in FIG. 11K, and are then transmitted to the write driver LWR<3> through the transfer gate TG70, which is always turned on by the power supply voltage VDD.

Thirteen, if the write data bits U<4> transmitted to the global I/O bus GIO_U<4> are input to the write multiplexer 313 shown in FIG. 11M, and the transfer gate TG71 is thus turned on according to a signal X16, the write data bits U<4> are transmitted to the write driver LWR<4>.

Fourteen, if the write data bits U<5> transmitted to the global I/O bus GIO_U<5> are input to the write multiplexer 314 shown in FIG. 11N, and the transfer gate TG74 is thus turned on according to a signal X16, the write data bits U<5> are transmitted to the write driver LWR<5>.

Fifteen, if the write data bits U<6> transmitted to the global I/O bus GIO_U<6> are input to the write multiplexer 315 shown in FIG. 11O, and the transfer gate TG78 is thus turned on according to a signal X16, the write data bits U<6> are transmitted to the write driver LWR<6>.

Sixteen, if the write data bits U<7> transmitted to the global I/O bus GIO_U<7> are input to the write multiplexer 316 shown in FIG. 11P, and the transfer gate TG80 is thus turned on according to a signal X16, the write data bits U<7> are transmitted to the write driver LWR<7>.

Figure 5:
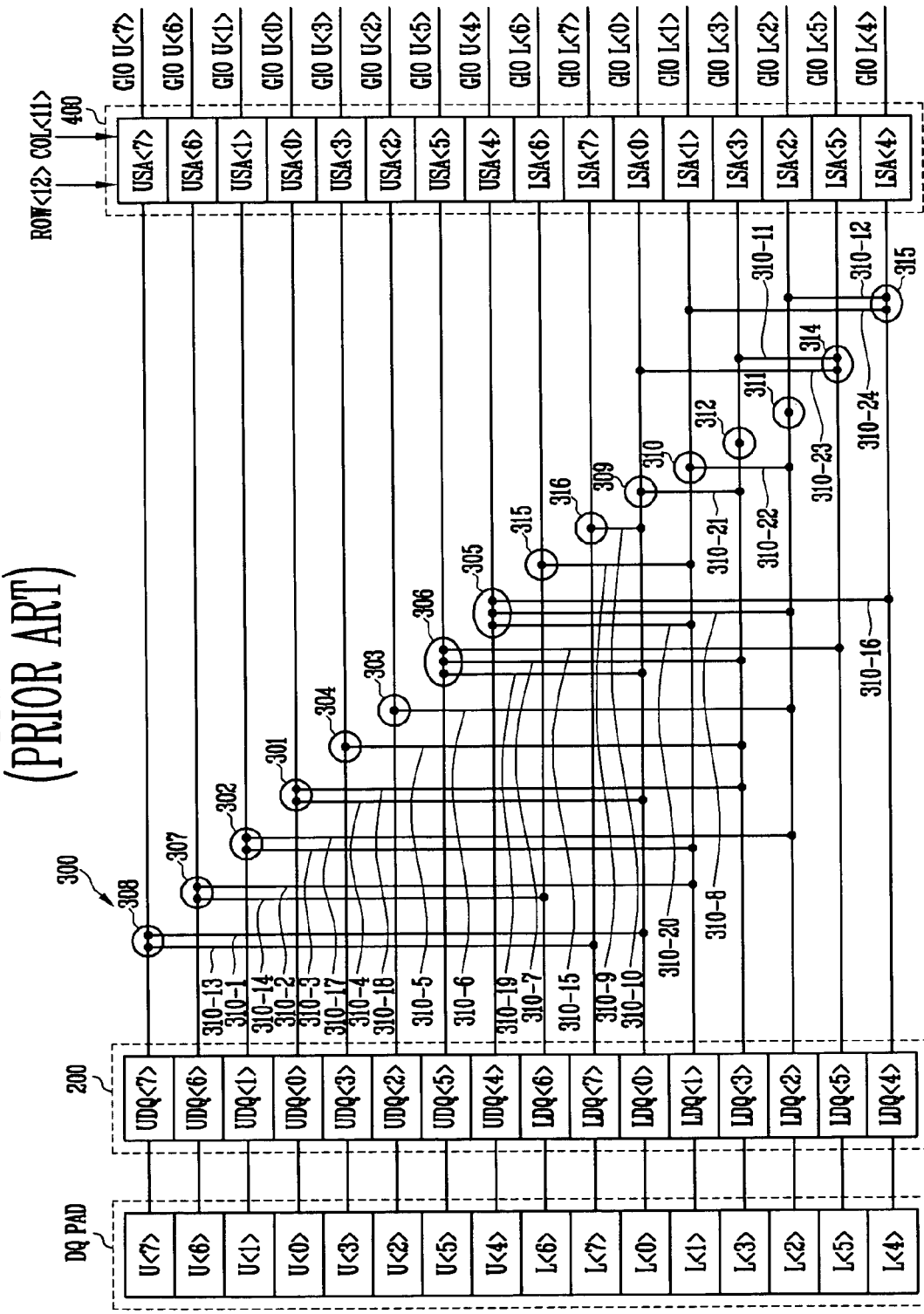
FIG. 5 is a block diagram of a scheme that multiplexes write data as shown in FIGS. 2 to 4.

As described above, in the prior art, the write multiplexer unit 300 is disposed between the write latch unit 200 and the data amplifier unit 400, as shown in FIG. 5, the 24 second metal lines (96 in the case of DR2 SDRAM, and 192 in the case of DDR3 SDRAM) was additionally needed. In the present invention, however, as shown in FIGS. 8 to 10, as the write multiplexer unit 300 is disposed right in front of the write driving unit 500 of the memory core region 10, the second metal lines that were additionally needed are not required. Instead, the write multiplexer unit 300 serves to multiplex the write data bits L<0:7> and U<0:7> received through the global I/O buses GIO_U<0:7> and GIO_L<0:7>.

As described above, according to the present invention, 96 second metal lines, which are needed in a peripheral region in the case of a DDR2 SDRAM, and 192 second metal lines, which are needed in the case of a DDR3 SDRAM, are obviated. Accordingly, the present invention is advantageous in that the layout is easy and the chip size is reduced.

Furthermore, write data to be written into memory cells are always directly transmitted to data I/O sense amplifiers through I/O pads. The time in which the write data reach from the I/O pads to the data I/O sense amplifiers from is the same. Time skew between data occurs less compared to the prior art. It is thus possible to improve tDQSS (time indicating when DQS (data strobe signal) is applied in synchronism with an external clock upon write operation), which is decided when a write latch unit transmits write data to a data amplifier.

Although the foregoing description has been made with reference to embodiments, it is to be understood that changes and modifications of the present invention may be made by a person of ordinary skill in the art without departing from the spirit and scope of the present invention and appended claims.

What is claimed is:

1. A semiconductor memory device, comprising:
   a memory core region including an array of memory cells;
   a data input path that receives data to be written into the memory cells from the outside;
   a first bus that receives the data through the data input path;
   a multiplexing unit that multiplexes the data received from the first bus wherein the first bus is a global I/O bus disposed between an amplifier unit and the multiplexer unit; and
   a driving unit that selects and drives the multiplexed data, wherein the multiplexing unit and the driving unit are included in the memory core region, and the multiplexing unit is disposed immediately in front of the driving unit, and multiplexes the data.

2. The semiconductor memory device as claimed in claim 1, further comprising a second bus coupled to the memory core region, whereby the data that are selected and driven by the driving unit are written into the memory cells through the second bus.

3. The semiconductor memory device as claimed in claim 1, wherein the data input path receives the data to be written into the memory cells only through first metal lines when receiving the data.

4. The semiconductor memory device as claimed in claim 3, wherein the number of the first metal lines is decided depending upon a data width and N-bit prefetch mode.

5. The semiconductor memory device as claimed in claim 1, wherein the data input path comprises:
   an I/O pad unit that receives the data to be written into the memory cells from the outside;
   a latch unit that latches the data received from the I/O pad unit; and
   an amplifier unit, which amplifies the data received from the latch unit and outputs the amplified data to the first bus.

6. The semiconductor memory device as claimed in claim 5, wherein the latch unit and the amplifier unit are composed of a plurality of latch circuits and a plurality of amplifiers, respectively, and are determined in number, depending upon a data width and a N-bit prefetch mode.

7. The semiconductor memory device as claimed in claim 6, wherein the data output from the latch circuits are transmitted to the respective amplifiers.

8. The semiconductor memory device as claimed in claim 6, wherein each of the plurality of the latch circuits and each of the plurality of the amplifiers has the data widths of X4, X8 and X16, and 16, 32 and 64 of the plurality of the latch circuits and the plurality of the amplifiers are driven in 4-bit prefetch mode.

9. The semiconductor memory device as claimed in claim 6, wherein each of the plurality of the latch circuits and each of the plurality of the amplifiers has the data widths of X4, X8 and X16, and 32, 64 and 128 of the plurality of the latch circuits and the plurality of the amplifiers are driven in 8-bit prefetch mode.

10. The semiconductor memory device as claimed in claim 1, wherein the multiplexing unit receives four data from the first bus when a data width is X4, multiplexes the four data into 16, and transmits the multiplexed data to the driving unit.

11. The semiconductor memory device as claimed in claim 1, wherein the multiplexing unit receives eight data from the first bus when a data width is X8, multiplexes the eight data into 16, and transmits the multiplexed data to the driving unit.

12. The semiconductor memory device as claimed in claim 1, wherein the multiplexing unit receives sixteen data from the first bus when a data width is X16, multiplexes the sixteen data into 16, and transmits the multiplexed data to the driving unit.

13. The semiconductor memory device as claimed in claim 1, wherein the driving unit selects only four data, which will be written into the memory cells, among the multiplexed data according to a highest row address and a column address when a data width is X4.

14. The semiconductor memory device as claimed in claim 1, wherein the driving unit selects only eight data, which will be written into the memory cells, among the multiplexed data according to a row address when a data width is X8.

15. The semiconductor memory device as claimed in claim 1, wherein the driving unit selects and drives all of the multiplexed data when a data width is X16.

16. A semiconductor memory device, comprising:
an array of memory cells;
I/O pads that receive data, which will be written into the memory cells, from the outside;
latch circuits that latch the data received from the I/O pad units;
amplifiers that amplify the data received from the latch circuits;
a first bus wherein the first bus is a global I/O bus disposed between the amplifiers and multiplexers that receives the amplified data from the amplifiers;
multiplexers that multiplex the data received from the first bus; and
driving circuits that select and drive the multiplexed data, where the multiplexers are disposed immediately in front of the driving circuits and multiplex the data.

17. The semiconductor memory device as claimed in claim 16, further comprising a second bus coupled to the array of the memory cells, whereby the data that are selected and driven by the driving unit are written into the memory cells through the second bus.

18. The semiconductor memory device as claimed in claim 16, wherein the latched data output from the latch circuits are transmitted to the respective amplifiers.

19. The semiconductor memory device as claimed in claim 16, wherein only first metal lines are disposed between the latch circuits and the amplifiers.

20. The semiconductor memory device as claimed in claim 19, wherein the number of the first metal lines is decided depending upon a data width and N-bit prefetch mode.

21. A method of multiplexing write data in a semiconductor memory device, the method comprising:
(a) receiving write data, which will be written into a memory cell, through an I/O pad;
(b) latching the write data received from the I/O pad;
(c) amplifying the latched write data;
(d) transmitting the amplified write data to a first bus wherein the first bus is a global I/O bus disposed between an amplifier unit and the multiplexer unit;
(e) multiplexing the write data output from the first bus; and
(f) selecting and driving the multiplexed write data,
wherein the multiplexing step is performed immediately before the write data are driven.

22. The method as claimed in claim 21, wherein the amplified write data are transmitted to a global I/O bus being the first bus.

23. The method as claimed in claim 21, wherein the multiplexing step includes receiving four write data from the first bus, and multiplexing the received four write data into 16, when a data width is X4.

24. The method as claimed in claim 21, wherein the multiplexing step includes receiving eight write data from the first bus, and multiplexing the received eight write data into 16, when a data width is X8.

25. The method as claimed in claim 21, wherein the multiplexing step includes receiving sixteen write data from the first bus, and multiplexing the received sixteen write data into 16, when a data width is X16.

26. The method as claimed in claim 21, further comprising:
transmitting the driven write data to a second bus; and
writing the write data that are transmitted to the second bus into the memory cell.

27. The method as claimed in claim 26, wherein the transmission step includes transmitting the driven write data to a local I/O bus being the second bus.

* * * * *